United States Patent
Lin et al.

(10) Patent No.: US 11,705,412 B2
(45) Date of Patent: Jul. 18, 2023

(54) DEVICE PACKAGE

(71) Applicant: Advanced Semiconductor Engineering, Inc., Kaohsiung (TW)

(72) Inventors: Cheng-Nan Lin, Kaohsiung (TW); Wei-Tung Chang, Kaohsiung (TW); Jen-Chieh Kao, Kaohsiung (TW); Huei-Shyong Cho, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/347,220

(22) Filed: Jun. 14, 2021

(65) Prior Publication Data

US 2021/0305181 A1   Sep. 30, 2021

Related U.S. Application Data

(63) Continuation of application No. 16/453,780, filed on Jun. 26, 2019, now Pat. No. 11,037,891.
(Continued)

(51) Int. Cl.
*H01L 23/66* (2006.01)
*H01L 23/31* (2006.01)
(Continued)

(52) U.S. Cl.
CPC .......... *H01L 23/66* (2013.01); *H01L 21/4853* (2013.01); *H01L 21/4857* (2013.01); *H01L 23/3128* (2013.01); *H01L 23/49822* (2013.01); *H01L 23/49833* (2013.01); *H01L 23/49838* (2013.01); *H01L 24/16* (2013.01); *H01Q 1/2283* (2013.01); *H01L 2223/6677* (2013.01);
(Continued)

(58) Field of Classification Search
CPC ............. H01L 23/66; H01L 2223/6677; H01L 2924/1421; H01Q 1/243; H01Q 21/065
See application file for complete search history.

(56) References Cited

U.S. PATENT DOCUMENTS 5,757,611 A   5/1998   Gurkovich et al.
2001/0050432 A1   12/2001   Seyyedy
(Continued)

FOREIGN PATENT DOCUMENTS

CN   102712520 B   6/2016
CN   107959109 A   4/2018

OTHER PUBLICATIONS

Final Office Action for U.S. Appl. No. 16/453,780, dated Nov. 27, 2020, 12 pages.
(Continued)

*Primary Examiner* — Selim U Ahmed
*Assistant Examiner* — Evan G Clinton
(74) *Attorney, Agent, or Firm* — Foley & Lardner LLP

(57) ABSTRACT

An electronic device package includes a first substrate, a second substrate and a conductive layer. The first substrate includes a first bonding pad, and a cavity exposing the first bonding pad. The second substrate is laminated on the first substrate. The second substrate includes a second bonding pad at least partially inserting into the cavity of the first substrate. The conductive layer is disposed in the cavity and at least between the first bonding pad and the second bonding pad to connect the first bonding pad and the second bonding pad.

12 Claims, 23 Drawing Sheets

Related U.S. Application Data

(60) Provisional application No. 62/735,000, filed on Sep. 21, 2018.

(51) Int. Cl.
  *H01L 23/498* (2006.01)
  *H01L 21/48* (2006.01)
  *H01Q 1/22* (2006.01)
  *H01L 23/00* (2006.01)
  *H01Q 1/24* (2006.01)

(52) U.S. Cl.
  CPC ............ *H01L 2224/16227* (2013.01); *H01L 2924/1421* (2013.01); *H01Q 1/243* (2013.01)

(56) References Cited

U.S. PATENT DOCUMENTS

| | | | |
|---|---|---|---|
| 2008/0124845 A1* | 5/2008 | Yu .................... | H01L 21/76898 438/143 |
| 2011/0187602 A1 | 8/2011 | Nair et al. | |
| 2012/0098121 A1* | 4/2012 | Chen ................. | H01L 21/76816 257/E21.294 |
| 2012/0217638 A1 | 8/2012 | Tanaka et al. | |
| 2014/0376193 A1* | 12/2014 | Lee ..................... | H01L 24/97 29/830 |
| 2015/0137349 A1* | 5/2015 | Chen ..................... | H01L 24/05 257/737 |
| 2017/0243846 A1 | 8/2017 | Chen et al. | |
| 2019/0131260 A1* | 5/2019 | Kirby .................. | H01L 24/81 |
| 2019/0280374 A1* | 9/2019 | Kim ................... | H01L 23/5389 |
| 2020/0303822 A1* | 9/2020 | Yao .................... | H01L 23/66 |
| 2020/0412021 A1* | 12/2020 | Chang ................. | H01Q 1/002 |

OTHER PUBLICATIONS

Microwaves101.com, "Miscellaneous Dielectric Constants," accessed via Wayback Machine to Mar. 1, 2015, 3 pages.
Non-Final Office Action for U.S. Appl. No. 16/453,780, daed Aug. 5, 2020, 12 pages.
Notice of Allowance for U.S. Appl. No. 16/453,780, dated Feb. 18, 2021, 10 pages.

* cited by examiner

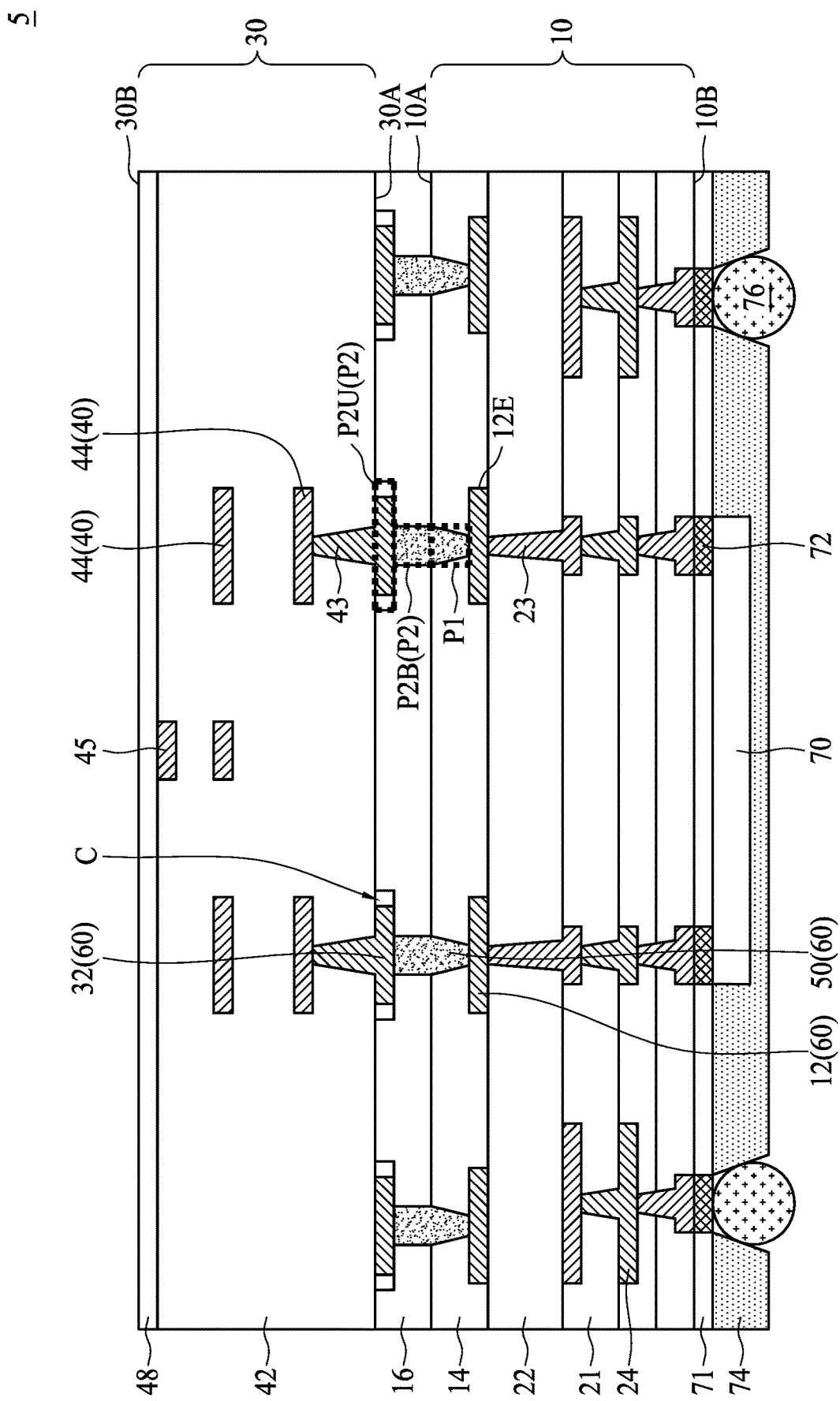

DEVICE PACKAGE

CROSS-REFERENCE TO RELATED APPLICATIONS

This application is a continuation of application Ser. No. 16/453,780, filed on Jun. 26, 2019, now U.S. Pat. No. 11,037,891, which claims priority to and the benefit of U.S. Provisional Application No. 62/735,000, filed Sep. 21, 2018, the content of which is incorporated herein by reference in its entirety.

BACKGROUND

1. Technical Field

The present disclosure relates to an electronic device package, and more particularly to an electronic device package including a conductive structure penetrating through an interface between two heterogeneous substrates.

2. Description of the Related Art

Wireless communication devices, such as cell phones, typically include antennas for transmitting and receiving radio frequency (RF) signals. A wireless communication device normally includes an antenna substrate and a communication substrate. The antenna substrate and the communication substrate have different requirements. For example, the dielectric layer(s) of the antenna substrate require relatively low dielectric constant (Dk) and relatively low dissipation factor (Df) to obtain desired peak gain and thinner thickness, while the dielectric layer(s) of the communication substrate require relatively high dielectric constant (Dk). A conventional wireless communication device uses an air layer as a dielectric layer of the antenna substrate. Air has low dielectric constant (Dk), but the gap (thickness) of the air layer is difficult to control, and thus the performance of the antenna is seriously affected.

SUMMARY

In some embodiments, an electronic device package includes a first substrate, a second substrate and a conductive layer. The first substrate includes a first bonding pad, and a cavity exposing the first bonding pad. The second substrate is laminated on the first substrate. The second substrate includes a second bonding pad at least partially inserting into the cavity of the first substrate. The conductive layer is disposed in the cavity and at least between the first bonding pad and the second bonding pad to connect the first bonding pad and the second bonding pad.

In some embodiments, an electronic device package includes a first substrate, a second substrate and a conductive structure. The second substrate is laminated on the first substrate. The first substrate and the second substrate include a heterogeneous interface. The conductive structure is embedded in the first substrate and the second substrate, and penetrating through the heterogeneous interface. The conductive structure includes a first bonding pad adjacent to the first substrate, a second bonding pad adjacent to the second substrate and electrically connected the first bonding pad.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 7 is a cross-sectional view of an electronic device package 5 in accordance with some embodiments of the present disclosure.

DETAILED DESCRIPTION

Figure 1:
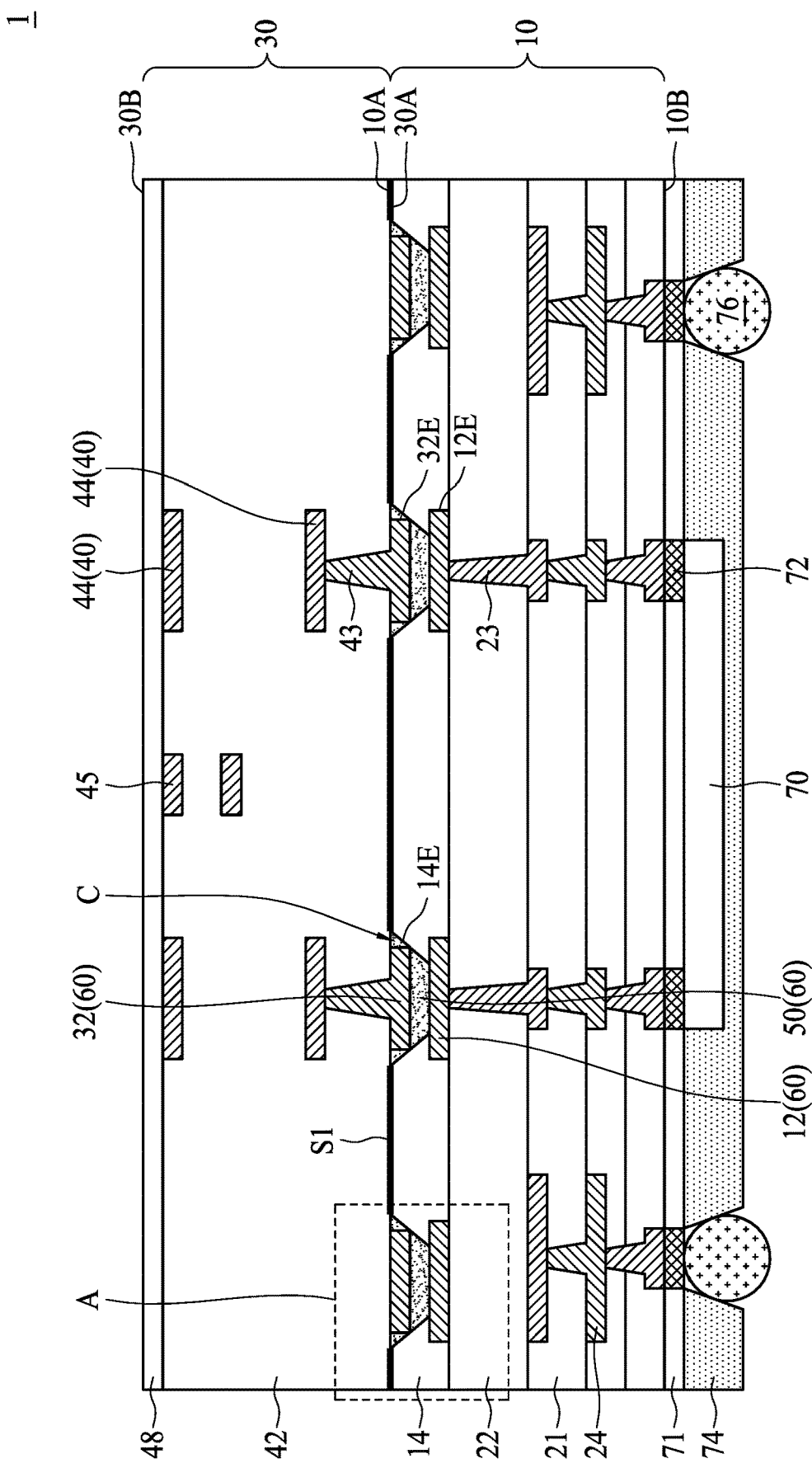
FIG. 1 is a cross-sectional view of an electronic device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The present disclosure provides for an electronic device package. The electronic device package includes two or more heterogeneous substrates or layers laminated to each other. The heterogeneous substrates are selected to meet different requirements of the electronic device package. For example, a high-k and rigid substrate is used to meet the requirement of communication circuit such as RF circuit, and a low-k and soft substrate is used to meet the peak gain requirement of antenna circuit with reduced thickness. The electronic device package includes a conductive structure penetrating through the heterogeneous interface between the heterogeneous substrates. The RF circuit and the antenna circuit of the heterogeneous substrates are directly connected through the heterogeneous interface by the conductive structure rather than being electrically coupled to each other through the heterogeneous interface, and thus the signal transmission loss across the heterogeneous interface is mitigated. Accordingly, power consumption of the electronic device package can be reduced.

Figure 1A:
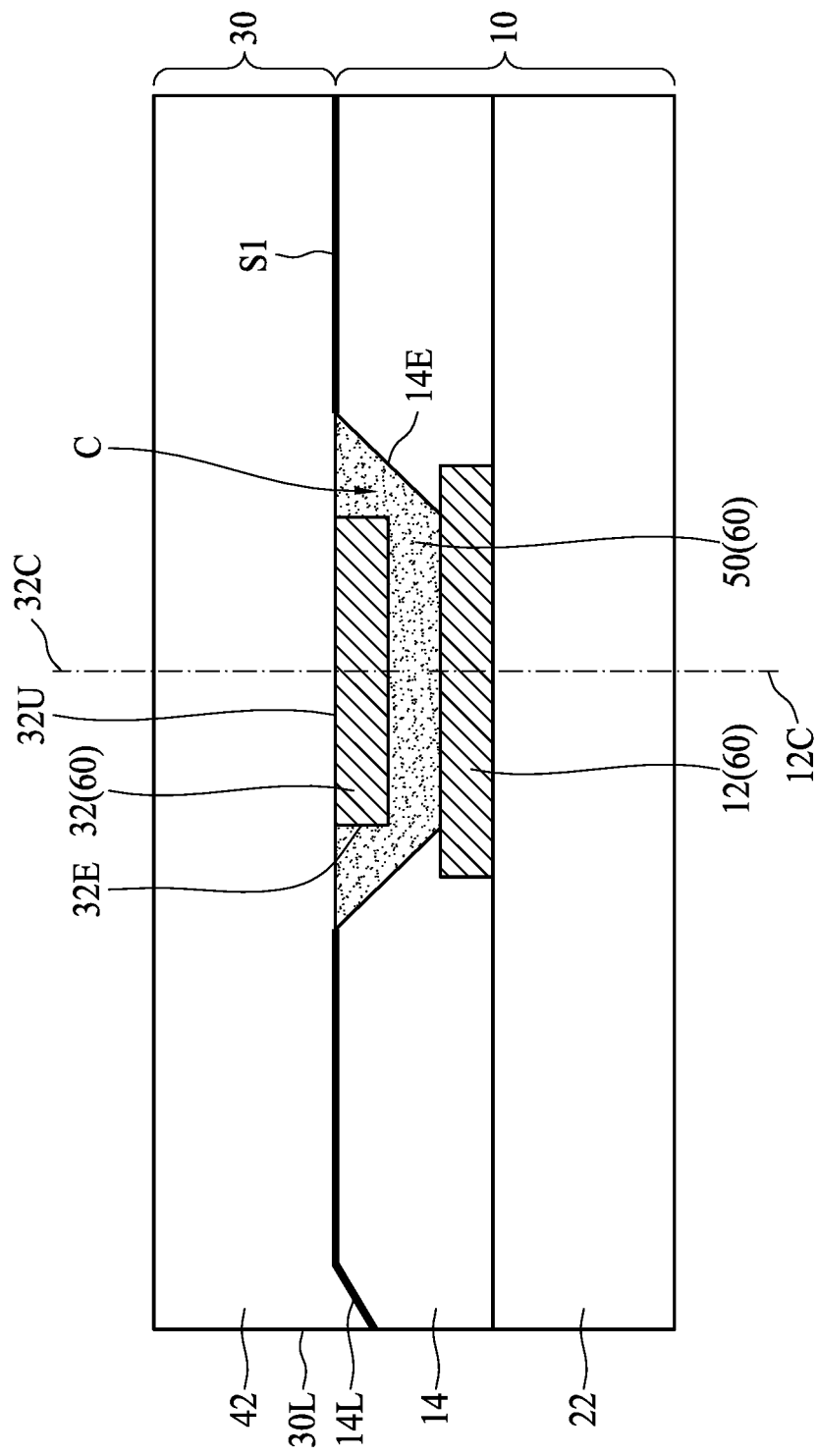
FIG. 1A is an enlarged cross-sectional view of region "A" in FIG. 1 in accordance with some embodiments of the present disclosure.
Figure 1B:
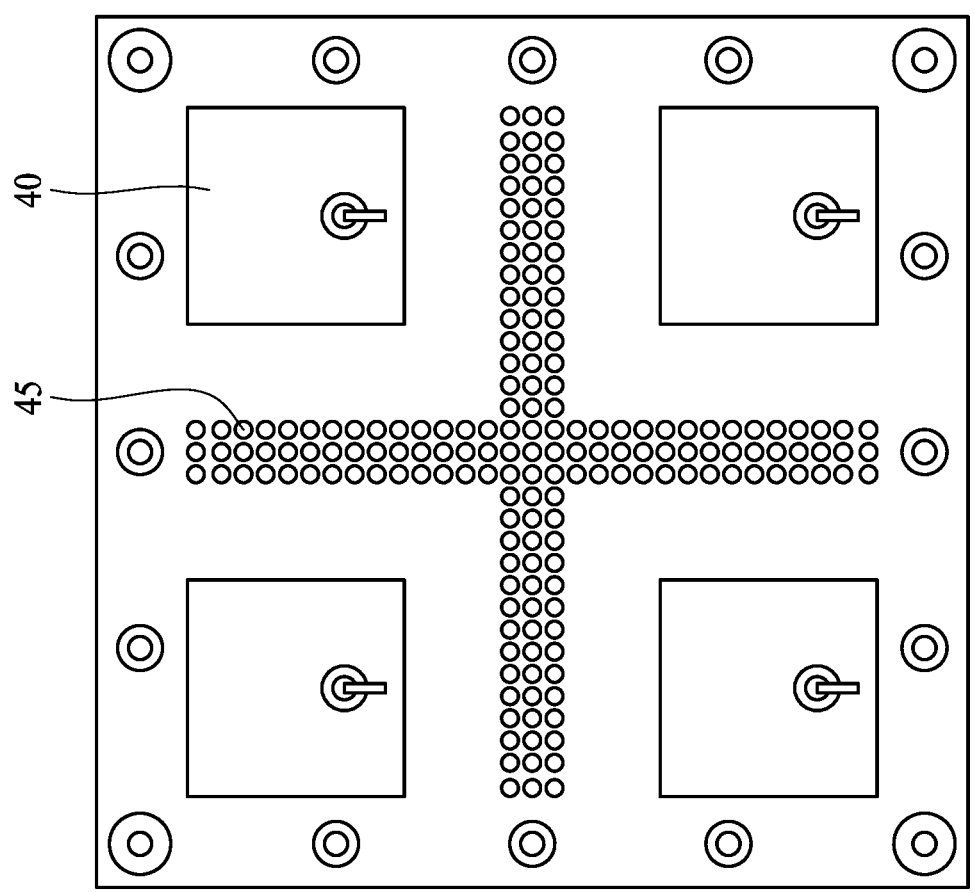
FIG. 1B is a top view of an electronic device package in accordance with some embodiments of the present disclosure.

FIG. 1 is a cross-sectional view of an electronic device package 1 in accordance with some embodiments of the present disclosure, FIG. 1A is an enlarged cross-sectional view of region "A" in FIG. 1 in accordance with some embodiments of the present disclosure, and FIG. 1B is a top view of an electronic device package 1 in accordance with some embodiments of the present disclosure. As shown in FIG. 1, FIG. 1A and FIG. 1B, the electronic device package 1 includes a first substrate 10, a second substrate 30 and a conductive layer 50. The first substrate 10 includes at least one bonding pad (also referred to as a first bonding pad) 12 disposed on, a surface (also referred to a first surface) 10A, and a cavity C at least partially exposing the bonding pad 12. In some embodiments, the first substrate 10 may include a package substrate such as a core substrate including a core layer 21, one or more dielectric layers 22 and one or more circuit layers 24 stacked to one another. The circuit layers 24 may be disposed on, adjacent to, or embedded in and exposed by the dielectric layers 22. The material of each of the dielectric layers 22 may individually include organic dielectric material such as epoxy-based material (e.g. FR4), resin-based material (e.g. Bismaleimide-Triazine (BT)), Polypropylene (PP)), molding compound or other suitable materials. The dielectric layers 22 may include transparent material, semi-transparent material or opaque material. The circuit layers 24 may be configured as a redistribution layer (RDL), and electrically connected to the conductive layer 50. In some embodiments, the circuit layers 24 may be electrically connected through conductive vias 23. The material of each of the circuit layers 24 and the conductive vias 23 may individually include metal such as copper or other suitable conductive material. In some other embodiments, the first substrate 10 may include a core-less substrate, and the core layer 21 can be omitted.

In some embodiments, the first substrate 10 may further include a passivation layer 14, and the passivation layer 14 may define at least a portion of the cavity C. In some embodiments, the passivation layer 14 partially covers the bonding pad 12, and defines an exposed area of the bonding pad 12.

In some embodiments, the electronic device package 1 may further include at least one semiconductor device 70 disposed on another surface (also referred to a second surface) 10B of the first substrate 10. The semiconductor device 70 is electrically connected to the circuit layers 24. The semiconductor device 70 may include but is not limited to, for example, an integrated circuit (IC) such as a radio frequency IC (RFIC), a semiconductor die or chip having circuitry therein. In some embodiments, an insulating layer 71 such as a solder mask or the like may be disposed on the surface 10B of the first substrate 10. The semiconductor device 70 may include a surface mount device (SMD) electrically connected to the circuit layers 22 by flit chip (FC) bonding through some conductive structures 72 such as conductive adhesives, conductive pads, conductive bumps, UBMs (under bump metallurgies) or the like. In some embodiments, an encapsulation layer 74 such as a molding compound layer may be disposed on the surface 10B of the first substrate 10 to encapsulate the semiconductor device 70. The encapsulation layer 74 may surround edges of the semiconductor device 70, and further covers an active surface and/or an inactive surface of the semiconductor device 70. In some embodiments, the encapsulation layer 74 may partially expose the circuit layer 24, and a plurality of connection elements 76 may be disposed on the surface 10B of the first substrate 10 and electrically connected to the exposed circuit layers 24. The connection elements 76 may include solder balls, solder bumps or the like, and electrically connected to the circuit layers 24 through some conductive structures 72.

The second substrate 30 is laminated on the first substrate 10. The second substrate 30 includes at least one bonding pad (also referred to as a second bonding pad) 32 at least partially inserting into the cavity C of the first substrate 10. The bonding pad 32 is disposed adjacent to a surface (also referred to a third surface) 30A of the second substrate 30. The bonding pad 32 of the second substrate 30 is electrically connected to the bonding pad 12 of the first substrate 10. The second substrate 30 may include one or more dielectric layers 42. The dielectric layers 42 each may include dielectric material. In some embodiments, the dielectric layers 42 each may include thermoset plastic, which may include liquid-based organic material and can be thermally and/or optically cured to provide adhesion ability. By way of example, the material for preparing the dielectric layer 42 may be a thermoset gel including monomer such as resin monomer, hardener, catalyst, solvent, diluent, fillers and other additives. The gel can be thermally or optically cured to form a polymer material. The second dielectric layer 30 may be softer than the first dielectric layer 10. In some other embodiments, the dielectric layers 42 may be stacked in advance, and then laminated on the first substrate 10. In some embodiments, the second substrate 30 and the first substrate 10 are in contact with each other. For example, an uppermost layer of the first substrate 10 such as the passivation layer 14 is in contact with a bottommost layer of the second substrate 30 such as the bottommost dielectric layer 42. The second substrate 30 and the first substrate 10 can be bonded surface by surface by, for example thermal compression lamination technique.

The second substrate 30 may include an antenna 40. The antenna 40 may include one or more circuit layers 44. In some embodiments, the circuit layers 44 of the antenna 40 are disposed in or between the dielectric layers 42. A first portion of the circuit layers 44 may be electrically connected to the bonding pad 32 through conductive vias 43 for example, and a second portion of the circuit layers 46 may be electrically coupled to the first portion of the circuit layers 44 and/or the bonding pad 32. The material of each of the circuit layers 44 and the conductive vias 43 may individually include metal such as copper or other suitable conductive material. In some alternative embodiments, one of the circuit layers 44 is exposed from another surface (also referred to a fourth surface) 30B of the second substrate 30, and an insulative layer 48 such as a solder mask may be disposed on the dielectric layer 42, covering the circuit layer 44. The antenna 40 may include, for example but is not limited to, a directional antenna, an omnidirectional antenna, an antenna array, a dipole antenna and/or a patch antenna. The antenna 40 may function as a broadside coupling antenna, or an End-Fire radiation antenna. In some embodiments, another antenna may be disposed in the dielectric layer 22 and near the edge of the dielectric layer 22, and configured as a dipole antenna for example.

In some embodiments, the second substrate 30 may further include at least one reinforced layer 45 configured to increase the robustness of the second substrate 30. The reinforced layer 45 does not overlap the circuit layer 44. In some embodiments, the reinforced layer 45 and the circuit layer 44 may be formed from the same patterned conductive layer and formed simultaneously.

The conductive layer 50 is disposed in the cavity C and at least between the bonding pad 12 of the first substrate 10 and the bonding pad 32 of the second substrate 30 to connect the bonding pad 12 and the bonding pad 32. In some embodiments, the material of the conductive layer 50 may include solder material such as tin (Sn), lead (Pb), silver (Ag), copper (Cu) or an alloy thereof. In some other embodiments, the material of the conductive layer 50 may include metal such as copper, silver or other suitable conductive material.

In some embodiments, the first substrate 10 may be configured as a communication substrate such as a radio frequency (RF) substrate, and the second substrate 30 may be configured as an antenna substrate. The first substrate 10 and the second substrate 30 are heterogeneous substrates including heterogeneous materials. The dielectric layers 22 of the first substrate 10 and the dielectric layers 42 of the second substrate 30 include heterogeneous materials different in their characteristics. The characteristics of the second substrate 30 and the first substrate 10 are individually configured to meet different requirements of the semiconductor device 70 such as RFIC and the antenna 40. For example, the dielectric constant (Dk) of the first substrate 10 is relatively higher such that the electrical requirement for the RFIC can be met, while the dielectric constant (Dk) of the second substrate 30 is controlled to be relatively lower such that the thickness of the second substrate 30 can be reduced, the peak gain of the antenna 40 can be increased and the signal transmission loss in transmission path of the antenna 40 can be mitigated.

The dielectric constant (Dk) of the dielectric layers 42 is relatively lower than that of the dielectric layers 22. For example, the dielectric constant (Dk) of the dielectric layers 42 ranges from about 3.0 to about 3.4 at a frequency of about 10 GHz, and is about 2.3 at a frequency of about 60 GHz. The dielectric constant (Dk) of the dielectric layers 22 ranges from about 3.4 to about 3.5 at a frequency of about 10 GHz. The dissipation factor (Df) of the dielectric layer 42 is relatively lower than that of the dielectric layer 22. For example, the dissipation factor (Df) of the dielectric layer 42 ranges from about 0.0016 to about 0.0128 at a frequency of about 10 GHz, and is about 0.0128 at a frequency of about 10 GHz. The dissipation factor (Df) of the dielectric layer 42 ranges from about 0.004 to about 0.005 at a frequency of about 10 GHz. The coefficient of thermal expansion (CTE) of the dielectric layer 42 is relatively higher than that of the dielectric layer 22. For example, the CTE of the dielectric layer 42 ranges from about 19 to about 110, and the CTE of the dielectric layer 22 ranges from about 11 to about 13. The Young's modulus of the dielectric layer 42 is relatively lower than that of the dielectric layer 22. For example, the Young's modulus of the dielectric layer 42 ranges from about 0.4 Gpa to about 13 GPa, and the Young's modulus of the dielectric layer 22 ranges from about 25 GPa to about 26 GPa.

The first substrate 10 and the second substrate 30 are heterogeneous materials, and thus the first substrate 10 and the second substrate 30 include a heterogeneous interface S1. The bonding pad 12 of the first substrate 10, the conductive layer 50 and the bonding pad 32 of the second substrate 30 collectively form a conductive structure 60 embedded in the first substrate 10 and the second substrate 30. The conductive structure 60 penetrates through the heterogeneous interface S1. As shown in FIG. 1, the bonding pad 12, the conductive layer 50 and the bonding pad 32 of the conductive structure 60 are electrically connected together rather than being electrically coupled, and thus the conductive structure 60 penetrating through the heterogeneous interface S1 can mitigate signal transmission loss.

As shown in FIG. 1A, the second substrate 30 may be a relatively softer substrate than the first substrate 10, and thus a lateral surface 30L of the second substrate 30 may extend to partially cover a lateral surface 14L of the passivation layer 14 of the first substrate 10.

In some embodiments, the conductive layer 50 is disposed between the bonding pad 12 and the bonding pad 32. The conductive layer 50 may further cover edges 32E of the bonding pad 32. The cavity C defined by the passivation layer 14 may include, but is not limited to be, a sidewall 14E inclined with respect to the surface 10A. For example, the cavity C may include a bowl-shaped profile with a larger aperture facing the second substrate 30. The bowl-shaped profile helps to guide the bonding pad 32 inserting into the cavity C such that the bonding pad 32 can be accurately connected to the conductive layer 50 and the bonding pad 12. For example, a central axis 12C of the bonding pad 12 is substantially aligned with a central axis 32C of the bonding pad 32 as shown in FIG. 1A. In some embodiments, an upper surface 32U of the bonding pad 32 distal to the bonding pad 12 is inserted into the cavity C, and lower than or substantially leveled with the heterogeneous interface S1 between the passivation layer 14 and the second substrate 30. In some embodiments, a width of the bonding pad 12 is larger than or substantially equal to a width of the bonding pad 32.

In some embodiments, the electrical resistivity of the bonding pad 12, the conductive layer 50, the bonding pad 32, the conductive via 23 and the conductive via 43 each are configured to improve the electrical performance of the conductive structure 60. For example, the electrical resistivity is controlled to be lower than $10^{-3}$ Ωcm, but is not limited thereto. In some embodiments, the resistance of the bonding pad 12, the conductive layer 50, the bonding pad 32, the conductive via 23 and the conductive via 43 each are configured such that the resistance in the central portion is close to the resistance in the perimeter portion to alleviate the skin effect. For example, the width or the cross-sectional area of the conductive layer 50 can be control to adjust the resistance of the conductive layer 50 in the central portion to match the resistance in the perimeter portion.

Figure 2A:
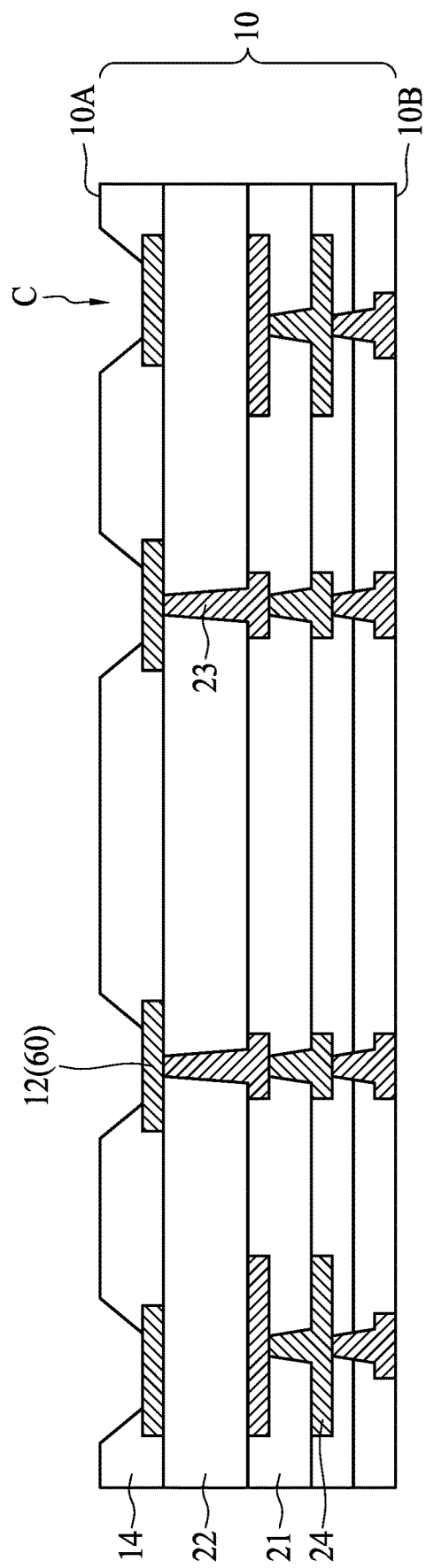
FIG. 2A, FIG. 2B, FIG. 2C and FIG. 2D illustrate operations for manufacturing an electronic device package in accordance with some embodiments of the present disclosure.

FIG. 2A, FIG. 2B, FIG. 2C and FIG. 2D illustrate operations for manufacturing an electronic device package 1 in accordance with some embodiments of the present disclosure. Referring to FIG. 2A, a first substrate 10 is provided. The first substrate 10 may be a pre-formed substrate. The first substrate 10 may include a core layer 21, one or more dielectric layers 22 and one or more circuit layers 24 stacked to one another. The first substrate 10 may further include bonding pads 12, and a passivation layer 14 exposing the bonding pads 12. In some embodiments, the core layer 21 may be omitted.

Figure 2B:
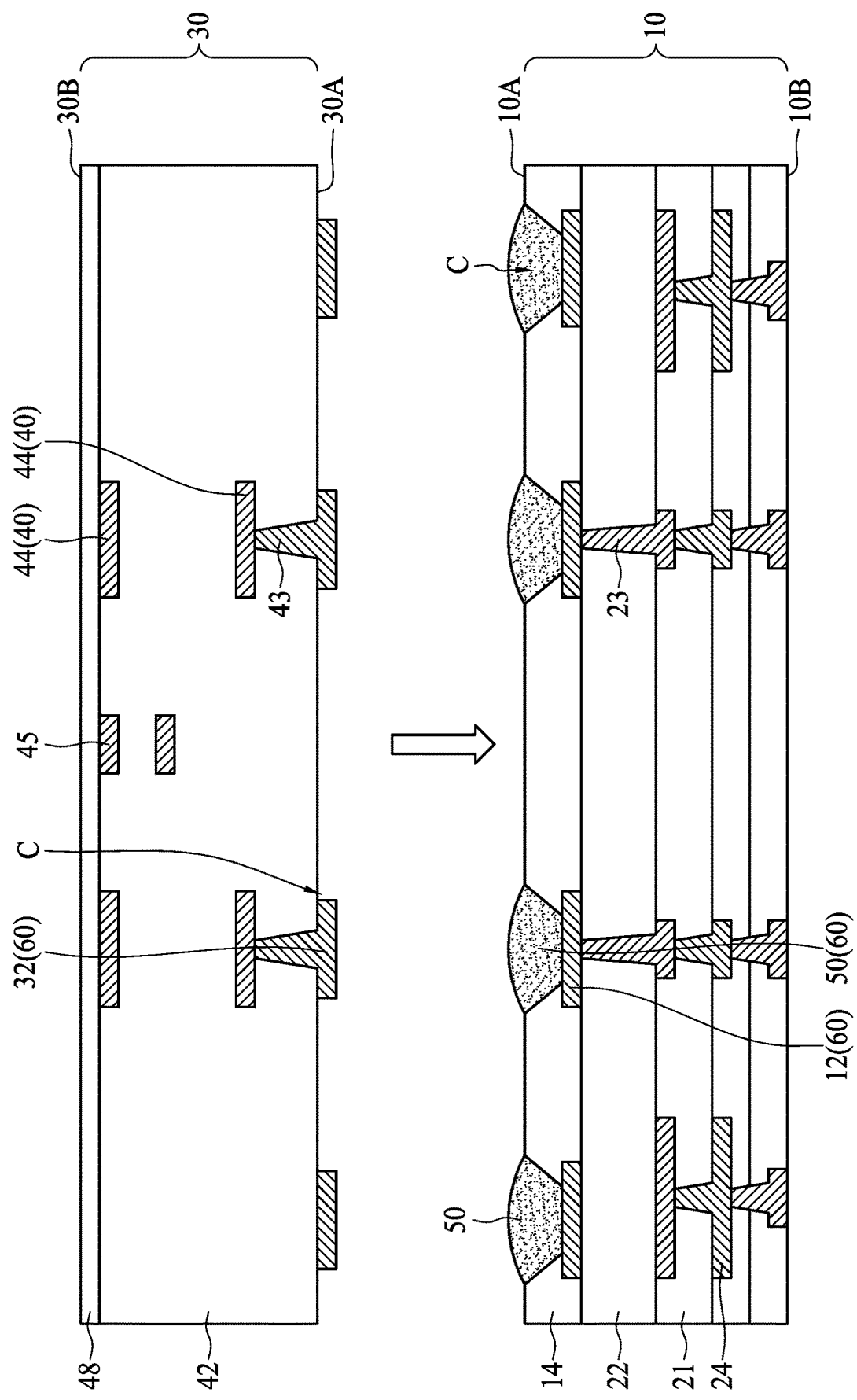

As shown in FIG. 2B, a conductive layer 50 is formed on the bonding pads 42 exposed from the passivation layer 14. A second substrate 30 is provided. The second substrate 30 may be a pre-formed substrate. The second substrate 30 may include one or more dielectric layers 42, and an antenna 40 including one or more circuit layers 44 stacked on the dielectric layers 42. The second substrate 30 may further include bonding pads 32 exposing from the dielectric layer 42, conductive vias 43 electrically connected to the bonding pads 32 and/or the circuit layers 44, and an insulating layer 48 over the dielectric layer 42. In some embodiments, the material of the dielectric layer 42 may include thermoset gel, which can be thermally and/or optically cured to provide adhesion ability.

Figure 2C:
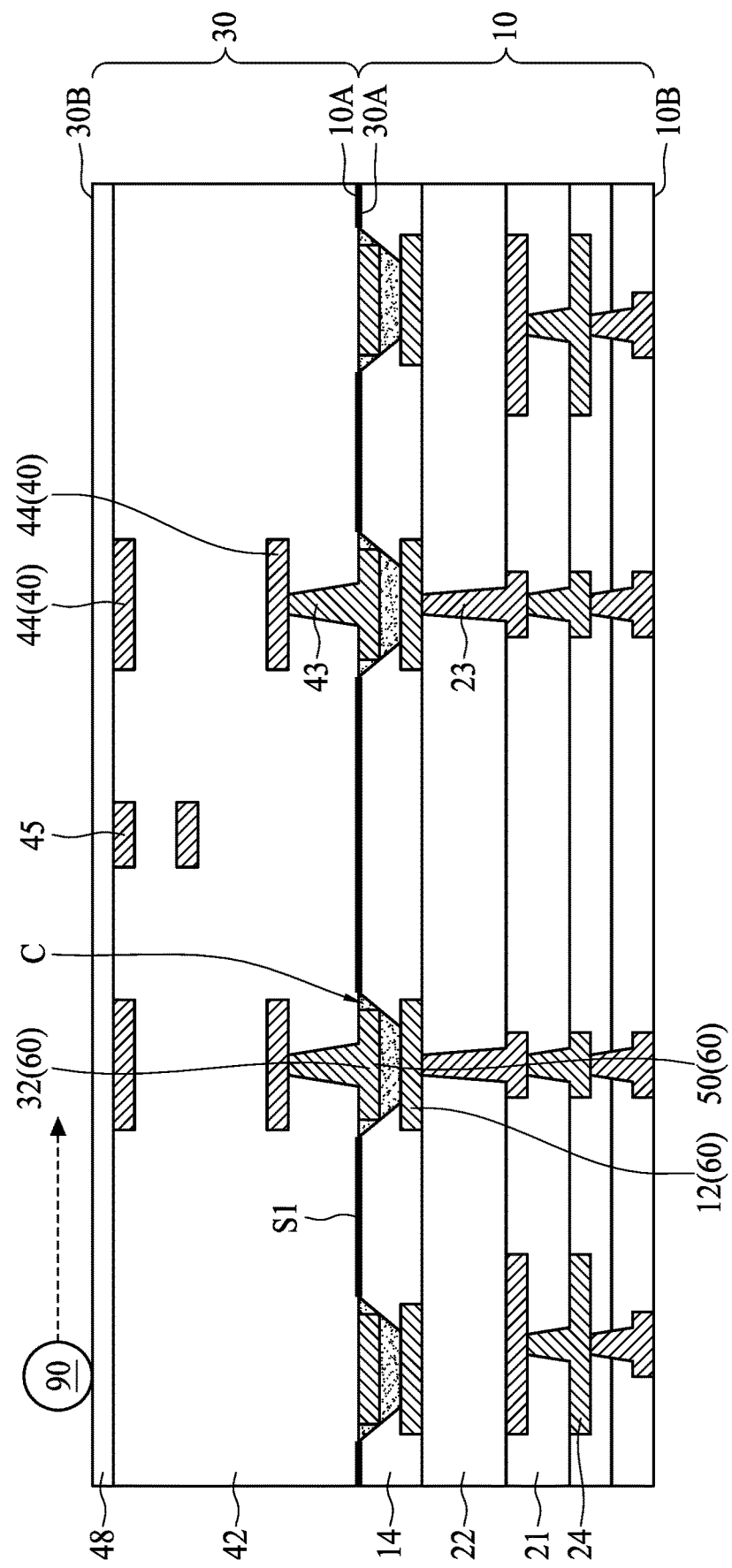

As shown in FIG. 2C, the second substrate 30 is laminated on the first substrate 10 with the bonding pads 32 facing and aligning with the conductive layer 50 and the bonding pads 12. In some embodiments, a pre-lamination is performed on the second substrate 30 and the first substrate 10 by a roller 90. In some embodiments, the thermoset gel of the dielectric layer 42 is in B stage after the pre-lamination.

Figure 2D:
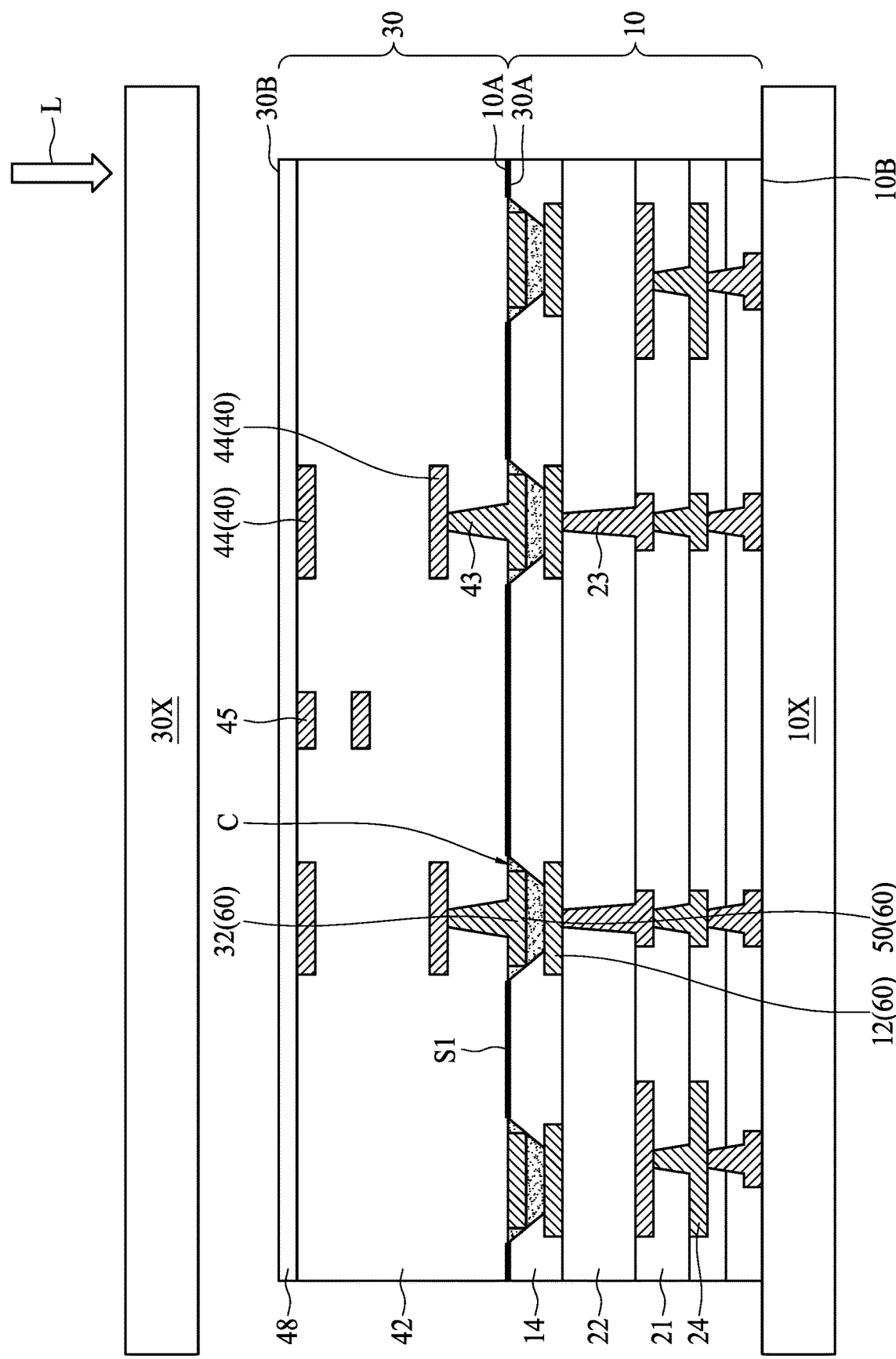

As shown in FIG. 2D, a lamination is performed on the second substrate 30 and the first substrate 10 by a thermal treatment. By way of example, the first substrate 10 is supported by a bottom lamination stage 10X, and the second substrate 30 is compressed by a top lamination stage 30X to provide a load L on the second substrate 30. The bottom lamination stage 10X and/or the top lamination stage 30X may be equipped with heaters to thermally treat the second substrate 30 and the first substrate 10. After the lamination, the thermoset gel of the dielectric layer 42 is fully cured and converted to C stage, such that the dielectric layer 42 has a cross-reactivity with the passivation layer 14 to enhance the adhesion between the first substrate 10 and the second substrate 30. In some embodiments, the first substrate 10 and the second substrate 30 can be singulated after the lamination to form a plurality of electronic device packages 1 as illustrated in FIG. 1.

The electronic device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 3:
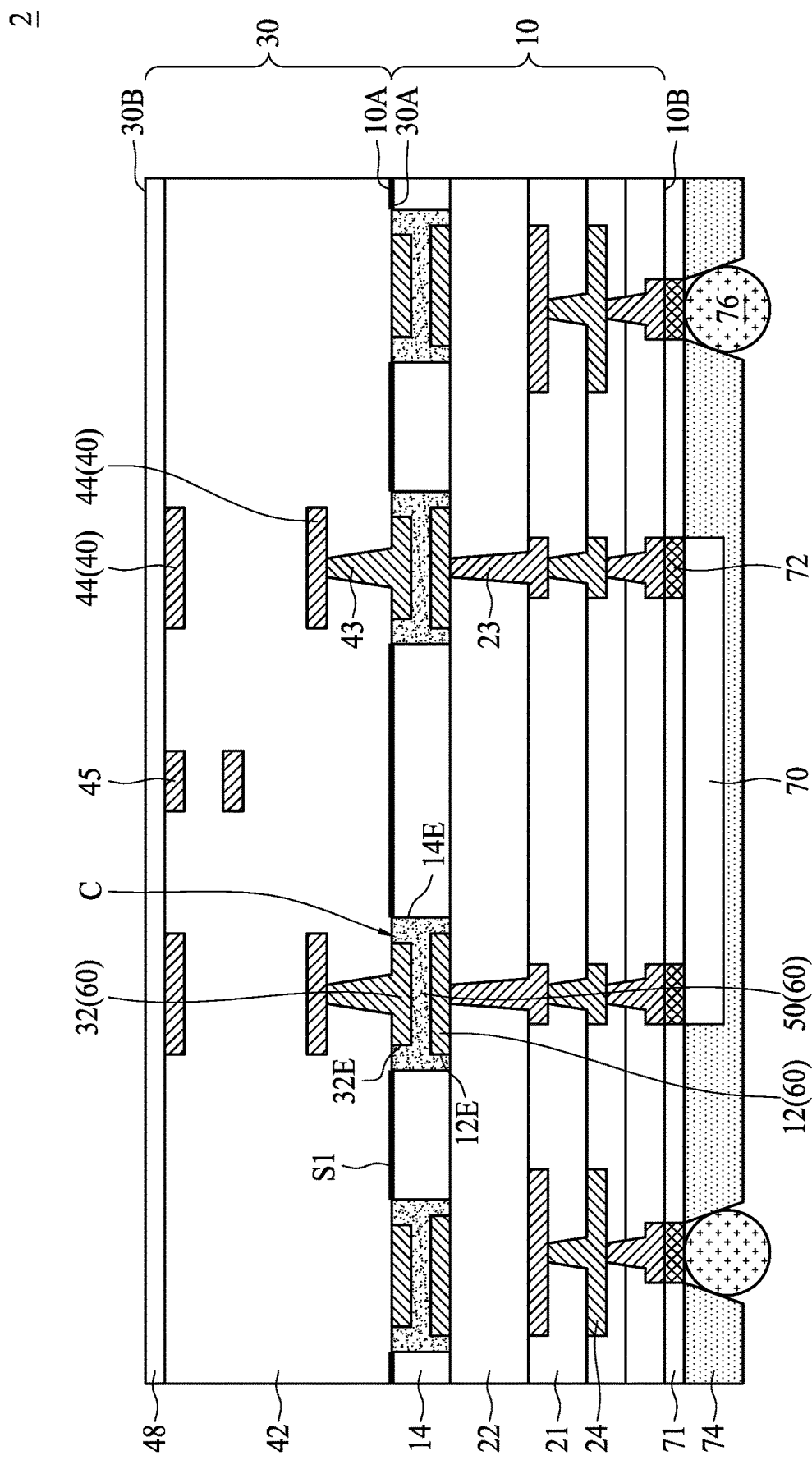
FIG. 3 is a cross-sectional view of an electronic device package in accordance with some embodiments of the present disclosure.

FIG. 3 is a cross-sectional view of an electronic device package 2 in accordance with some embodiments of the present disclosure. As shown in FIG. 3, the passivation layer 14 of the electronic device package 2 does not cover the bonding pad 12, and is spaced from the bonding pad 12. In some embodiments, the sidewall 14E of the cavity C may, but not be limited to, be substantially perpendicular to the surface 10A of the first substrate 10. In some embodiments, the sidewall 14E of the cavity C may be inclined with respect to the surface 10A. In some embodiments, the conductive layer 50 is disposed between the bonding pad 12 and the bonding pad 32. The conductive layer 50 may further cover edges 32E of the bonding pad 32 and/or edges 12E of the bonding pad 12.

Figure 4:
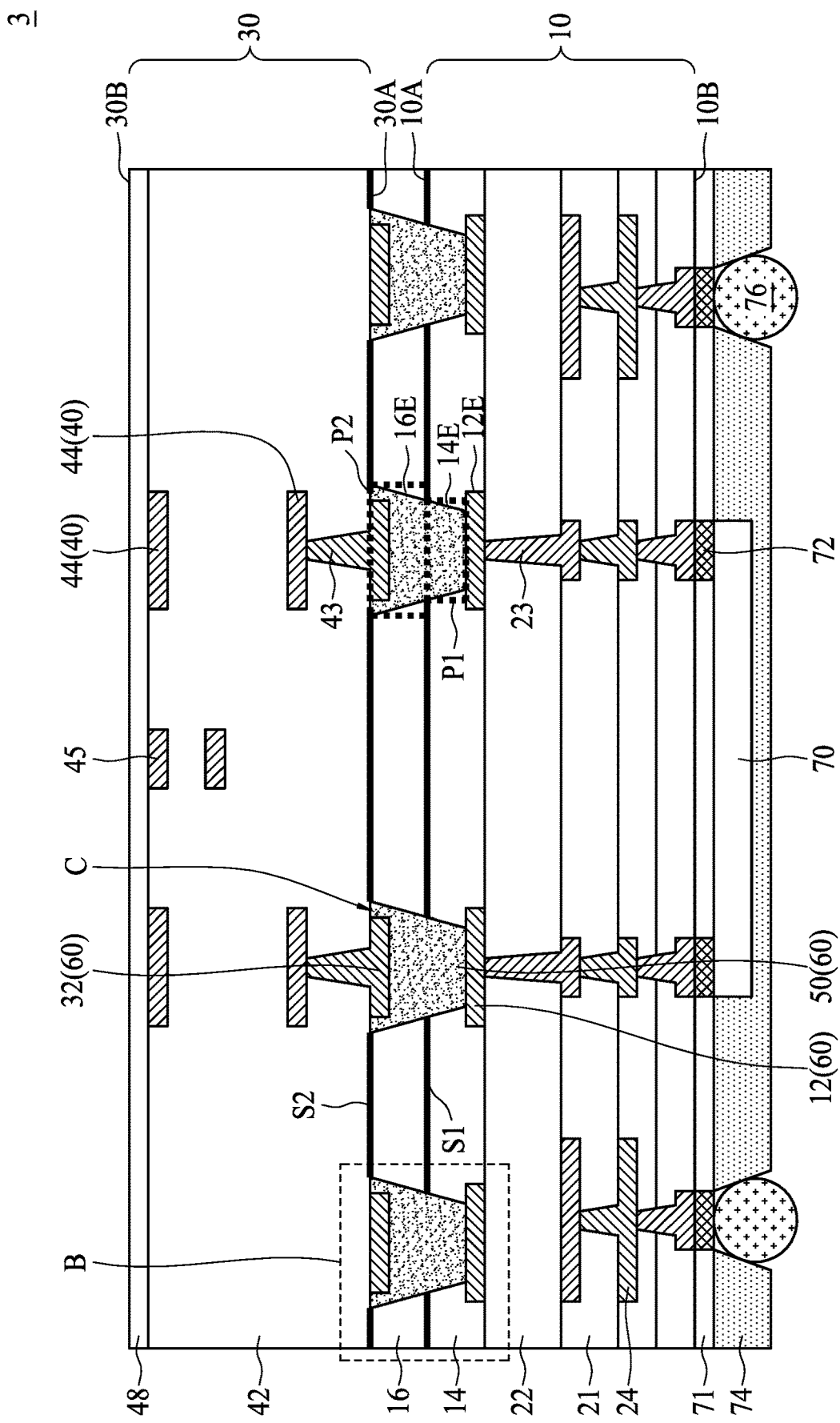
FIG. 4 is a side view of an electronic device package in accordance with some embodiments of the present disclosure.

FIG. 4 is a side view of an electronic device package 3 in accordance with some embodiments of the present disclosure. As shown in FIG. 4, in contrast to the electronic device package 1 of FIG. 1, the first substrate 10 of the electronic device package 3 further includes an adhesion layer 16 disposed between the passivation layer 14 and the second substrate 30. The passivation layer 14 and the adhesion layer 16 may collectively define the cavity C. By way of example, the passivation layer 14 defines a first portion P1 of the cavity C, and the adhesion layer 16 defines a second portion P2 of the cavity C. The adhesion layer 16, the first substrate 10 and the second substrate 30 may all be heterogeneous materials, and thus the first substrate 10 and the second substrate 30 include a heterogeneous interface S1, while the adhesion layer 16 and the second substrate 30 include another heterogeneous interface S2. In some embodiments, the upper surface 32U of the bonding pad 32 distal to the bonding pad 12 may be lower than or substantially leveled with the heterogeneous interface S2 between the adhesion layer 16 and the second substrate 30. In some embodiments, a width of the bonding pad 12 is larger than or substantially equal to a width of the bonding pad 32. The conductive layer 50 is disposed between the bonding pad 12 and the bonding pad 32. The conductive layer 50 may further cover edges 32E of the bonding pad 32.

The dielectric layers 42, the dielectric layers 22 and the adhesion layer 16 may be heterogeneous materials and have different properties. For example, the dielectric constant (Dk) of the dielectric layers 42 ranges from about 3.0 to about 3.4 at a frequency of about 10 GHz, and is about 2.3 at a frequency of about 60 GHz. The dielectric constant (Dk) of the dielectric layers 22 ranges from about 3.4 to about 3.5 at a frequency of about 10 GHz. The dielectric constant (Dk) of the adhesion layer 16 is about 3.1 at a frequency of about 10 GHz. The dissipation factor (Df) of the dielectric layer 42 ranges from about 0.0016 to about 0.0128 at a frequency of about 10 GHz, and is about 0.0128 at a frequency of about 10 GHz. The dissipation factor (Df) of the dielectric layer 42 ranges from about 0.004 to about 0.005 at a frequency of about 10 GHz. The dissipation factor (Df) of the adhesion layer 16 is about 0.0016 at a frequency of about 10 GHz. The CTE of the dielectric layer 42 ranges from about 19 to about 110. The CTE of the dielectric layer 22 ranges from about 11 to about 13. The CTE of the adhesion layer 16 is about 70. The Young's modulus of the dielectric layer 42 ranges from about 0.4 Gpa to about 13 GPa. The Young's modulus of the dielectric layer 22 ranges from about 25 GPa to about 26 GPa. The Young's modulus of the adhesion layer 16 is about 0.75 GPa.

In some embodiments, the adhesion layer 16 may include thermoset tape, which can be thermally and/or optically cured to provide adhesion ability. By way of example, the material of the adhesion layer 16 may be a thermoset gel including monomer such as resin monomer, hardener, catalyst, solvent, diluent, fillers and other additives. The gel can be thermally or optically cured to form a polymer material. The adhesion layer 16 may be softer than the first dielectric layer 10.

Figure 4A:
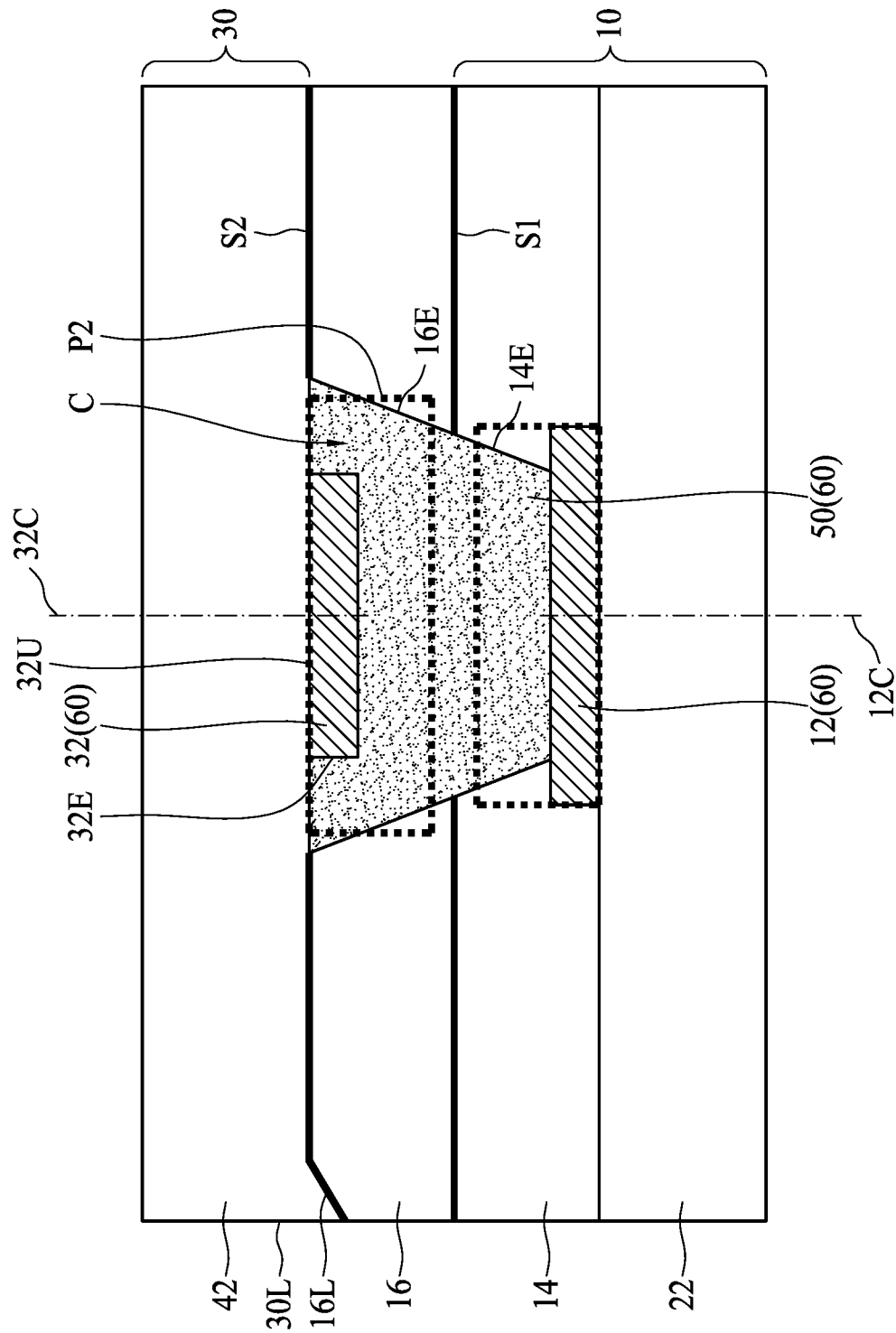
FIG. 4A is an enlarged cross-sectional view of region "B" in FIG. 4 in accordance with some embodiments of the present disclosure.

FIG. 4A is an enlarged cross-sectional view of region "B" in FIG. 4 in accordance with some embodiments of the present disclosure. As shown in FIG. 4A, the second substrate 30 may be relatively softer than the adhesion layer 16, and thus a lateral surface 30L of the second substrate 30 may extend to partially cover a lateral surface 16L of the adhesion layer 16 of the adhesion layer 16. The cavity C defined by the passivation layer 14 and the adhesion layer 16 may include, but is not limited to be, a sidewall 14E and a sidewall 16E inclined with respect to the surface 10A. For example, the cavity C may include a bowl-shaped profile with a larger aperture facing the second substrate 30. The bowl-shaped profile helps to guide the bonding pad 32 inserting into the cavity C such that the bonding pad 32 can be accurately connected to the conductive layer 50 and the bonding pad 12. For example, a central axis 12C of the bonding pad 12 is substantially aligned with a central axis 32C of the bonding pad 32 as shown in FIG. 4A.

In some embodiments, the electrical resistivity of the bonding pad 12, the conductive layer 50, the bonding pad 32, the conductive via 23 and the conductive via 43 each are configured to improve the electrical performance of the conductive structure 60. For example, the electrical resistivity is controlled to be lower than $10^{-3}$ Ωcm, but is not limited thereto. In some embodiments, the resistance of the bonding pad 12, the conductive layer 50, the bonding pad 32, the conductive via 23 and the conductive via 43 each are configured such that the resistance in the central portion is close to the resistance in the perimeter portion to alleviate the skin effect.

Figure 5A:
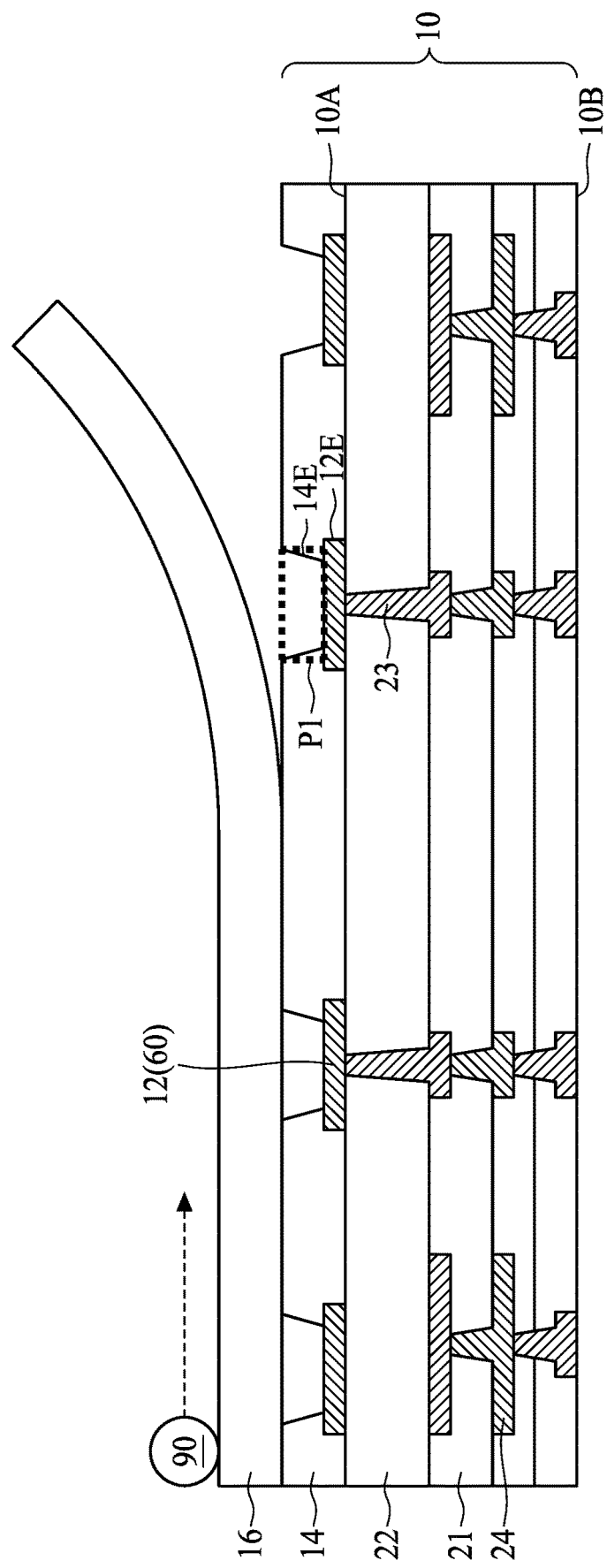
FIG. 5A, FIG. 5B, FIG. 5C, FIG. 5D and FIG. 5E illustrate operations for manufacturing an electronic device package in accordance with some embodiments of the present disclosure.

FIG. 5A, FIG. 5B, FIG. 5C, FIG. 5D and FIG. 5E illustrate operations for manufacturing an electronic device package 3 in accordance with some embodiments of the present disclosure. Referring to FIG. 5A, a first substrate 10 is provided. The first substrate 10 may be a pre-formed substrate. The first substrate 10 may include a core layer 21, one or more dielectric layers 22 and one or more circuit layers 24 stacked to one another. The first substrate 10 may further include bonding pads 12, and a passivation layer 14 defining first portions P1 of the cavities C exposing the bonding pads 12. In some embodiments, the core layer 21 may be omitted. An adhesion layer 16 is then laminated on the first substrate 10. In some embodiments, a pre-lamination is performed on the adhesion layer 16 and the first substrate 10 by a roller 90. In some embodiments, the thermoset tape of the adhesion layer 16 is in A stage after the pre-lamination.

Figure 5B:
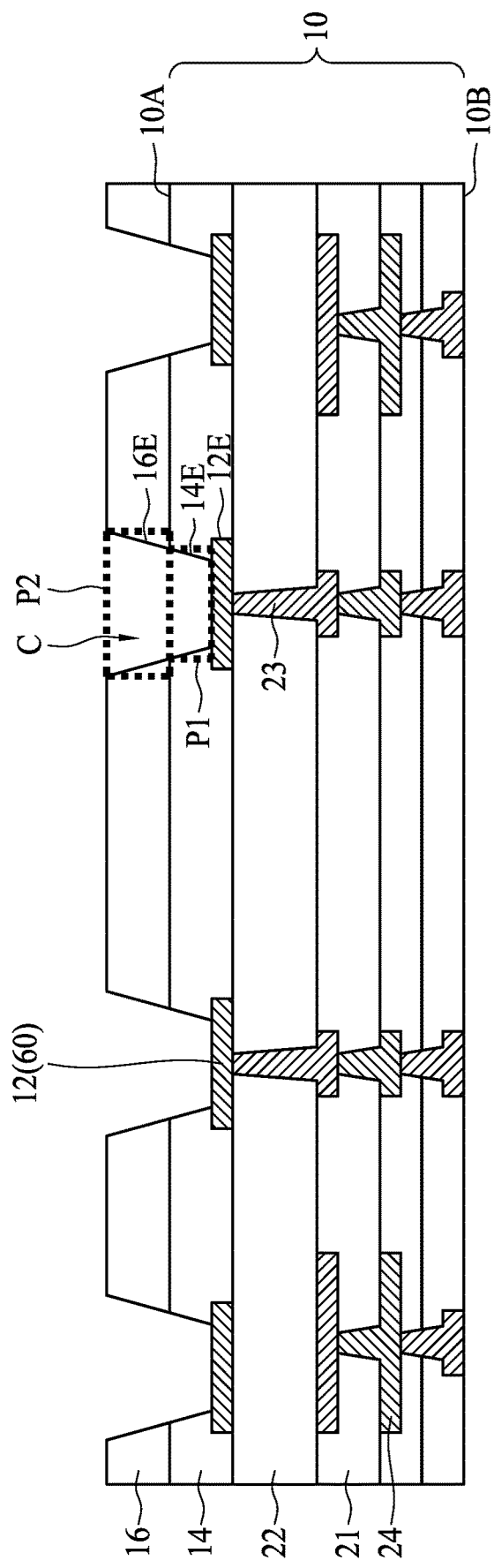
Figure 5C:
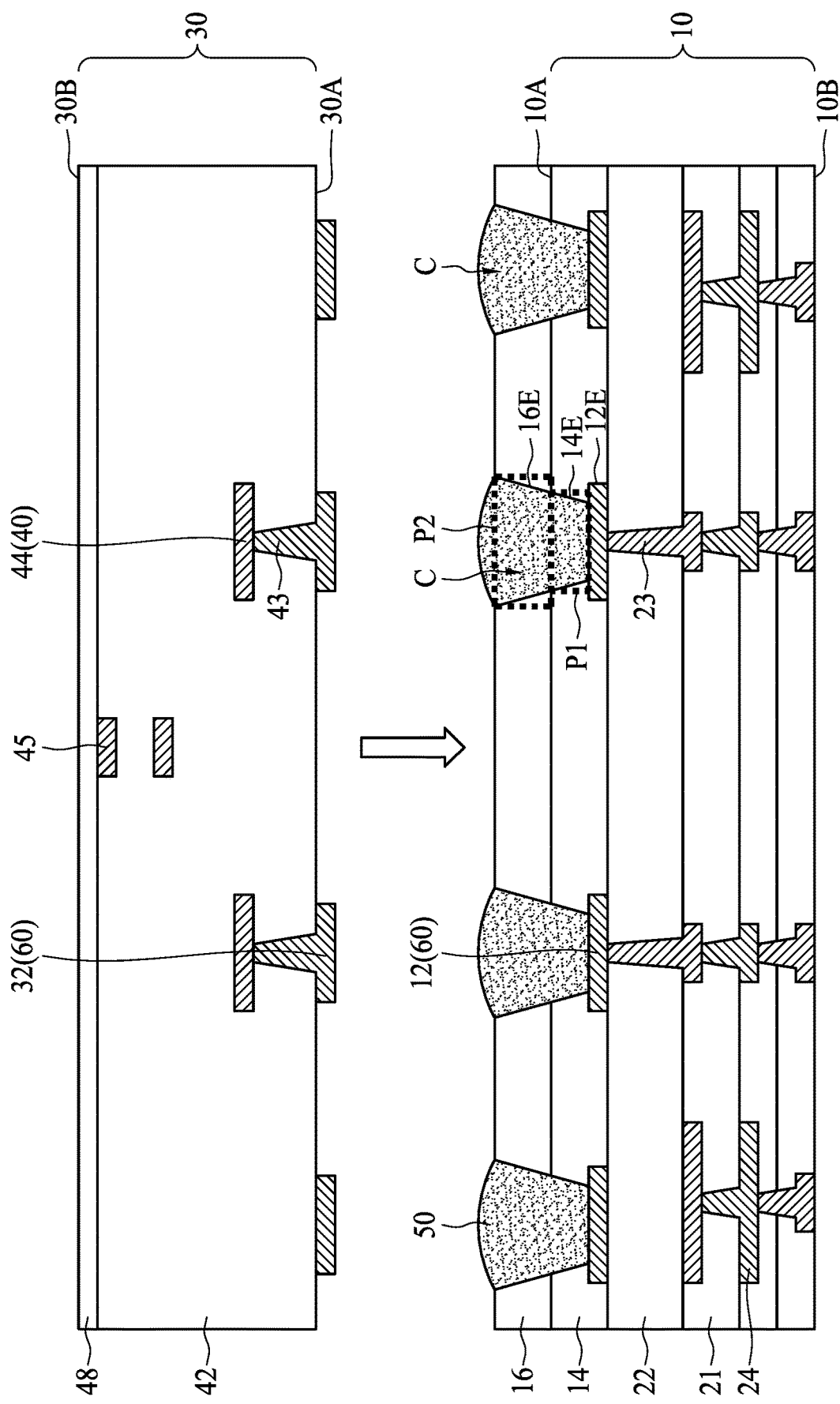

As shown in FIG. 5B, the adhesion layer 16 is then patterned to form second portions P2 of the cavities C exposing the bonding pads 12. In some embodiments, the adhesion layer 16 may be patterned by drilling such as laser drilling. As shown in FIG. 5C, a conductive layer 50 is formed in the cavities C on the bonding pads 42 exposed from the passivation layer 14 and the adhesion layer 16. A second substrate 30 is provided. The second substrate 30 may be a pre-formed substrate. The second substrate 30 may include one or more dielectric layers 42, and an antenna 40 including one or more circuit layers 44 stacked on the dielectric layers 42. The second substrate 30 may further include bonding pads 32 exposing the dielectric layer 42, conductive vias 43 electrically connected to the bonding pads 32 and/or the circuit layers 44, and an insulating layer 48 over the dielectric layer 42.

Figure 5D:
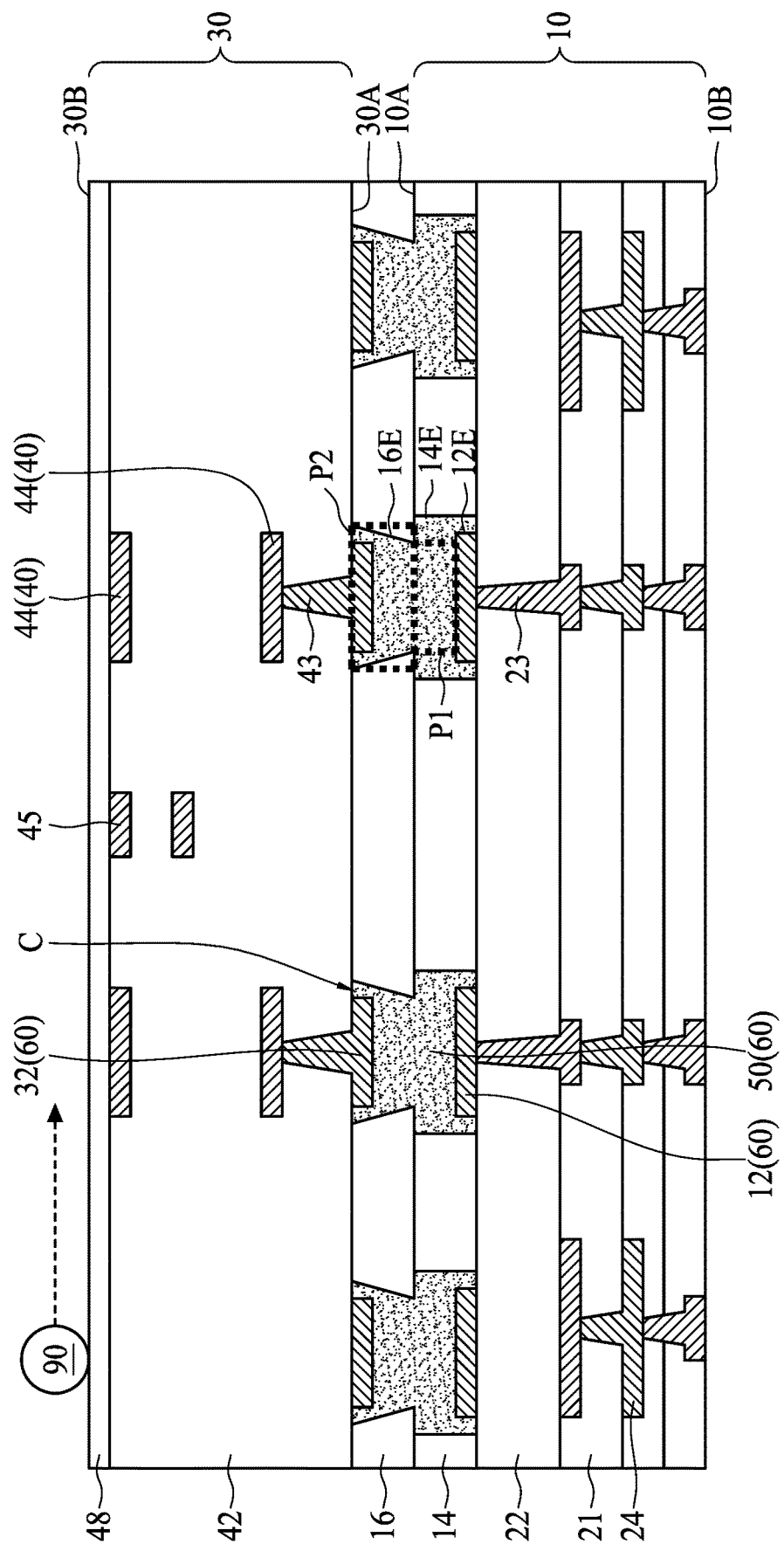

As shown in FIG. 5D, the second substrate 30 is laminated on the adhesion layer 16 with the bonding pads 32 facing and aligning with the conductive layer 50 and the bonding pads 12. In some embodiments, a pre-lamination is performed on the second substrate 30 and adhesion layer 16 by a roller 90. In some embodiments, the thermoset tape of the adhesion layer 16 is in B stage after the pre-lamination.

Figure 5E:
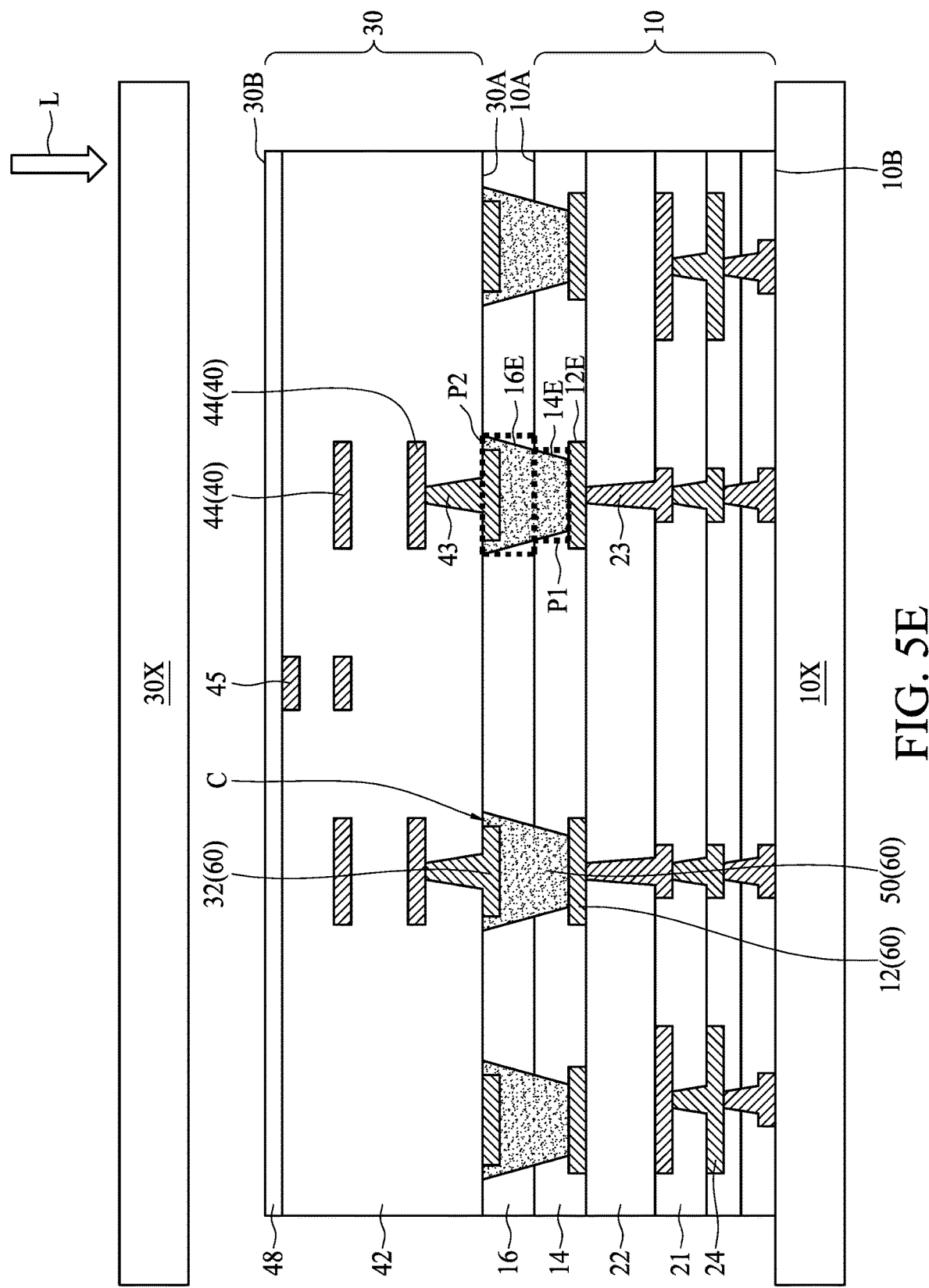

As shown in FIG. 5E, a lamination is performed on the second substrate 30 and adhesion layer 16 by a thermal treatment. By way of example, the first substrate 10 is supported by a bottom lamination stage 10X, and the second substrate 30 is compressed by a top lamination stage 30X to provide a load L on the second substrate 30. The bottom lamination stage 10X and/or the top lamination stage 30X may be equipped with heaters to thermally treat the second substrate 30, the adhesion layer 16 and the first substrate 10. After the lamination, the thermoset tape of the adhesion layer 16 is fully cured and converted to C stage such that the adhesion layer 16 has a cross-reactivity with the passivation layer 14 and the dielectric layer 42 to enhance the adhesion between the first substrate 10 and the second substrate 30. In some embodiments, the first substrate 10 and the second substrate 30 can be singulated after the lamination to form a plurality of electronic device packages 3 as illustrated in FIG. 4.

Figure 6:
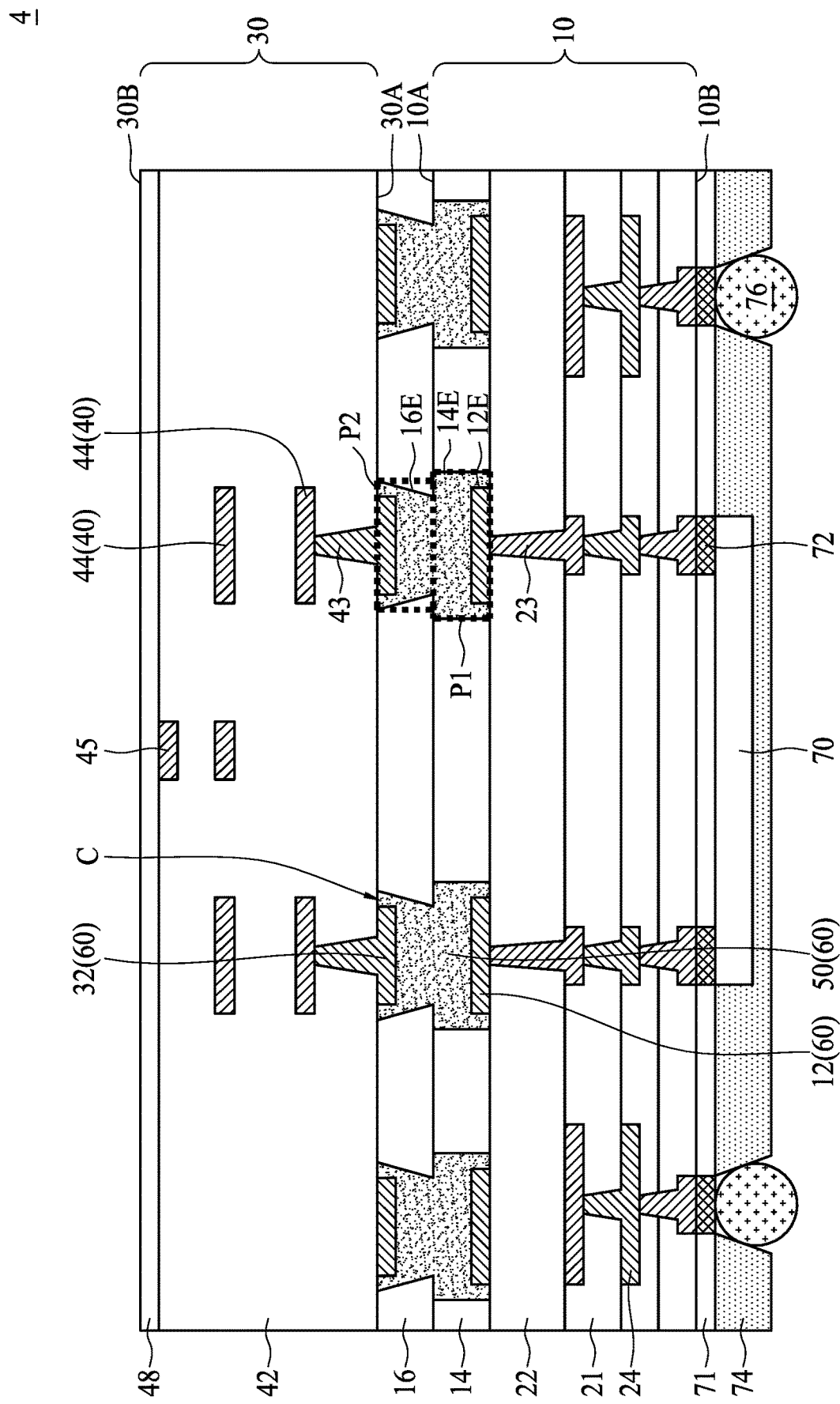
FIG. 6 is a cross-sectional view of an electronic device package in accordance with some embodiments of the present disclosure.

FIG. 6 is a cross-sectional view of an electronic device package 4 in accordance with some embodiments of the present disclosure. As shown in FIG. 6, the passivation layer 14 of the electronic device package 4 does not cover the bonding pad 12, and is spaced from the bonding pad 12. In some embodiments, the sidewall 14E of the passivation layer 14 and the sidewall 16E of the adhesion layer 16 may not be connected continuously. By way of example, the sidewall 14E be substantially perpendicular to the surface 10A, and the sidewall 16E may be inclined with respect to the surface 10A of the first substrate 10. The conductive layer 50 is disposed between the bonding pad 12 and the bonding pad 32, and may further cover edges 32E of the bonding pad 32 and/or edges 12E of the bonding pad 12.

FIG. 7 is a cross-sectional view of an electronic device package 5 in accordance with some embodiments of the present disclosure. As shown in FIG. 7, the passivation layer 14 partially covers the bonding pad 12, and defines the first portion P1 of the cavity C. The adhesion layer 16 may have a step-shaped profile. For example, the second portion P2 of the cavity C defined by the adhesion layer 16 may have an upper portion P2U and a bottom portion P2B connected to the upper portion P2U. In some embodiments, the bottom portion P2B of the second portion P2 and the first portion P1 of the cavity C are filled with the conductive layer 50, while the upper portion P2U is not filled with the conductive layer 50. In some embodiments, the width or cross-sectional area of the bottom portion P2B is substantially equal to that of the first portion P1. In some embodiments, the width or cross-sectional area of the bottom portion P2B is narrower compared to that of the upper portion P2U, and thus the resistance of the conductive layer 50 in the central region can be reduced to be close to that in the perimeter region to alleviate skin effect. Accordingly, signal transmission loss can be mitigated, particularly in high frequency application. In addition, the narrower bottom portion P2B also helps to guide the conductive layer 50, and thus can increase alignment accuracy.

Figure 8A:
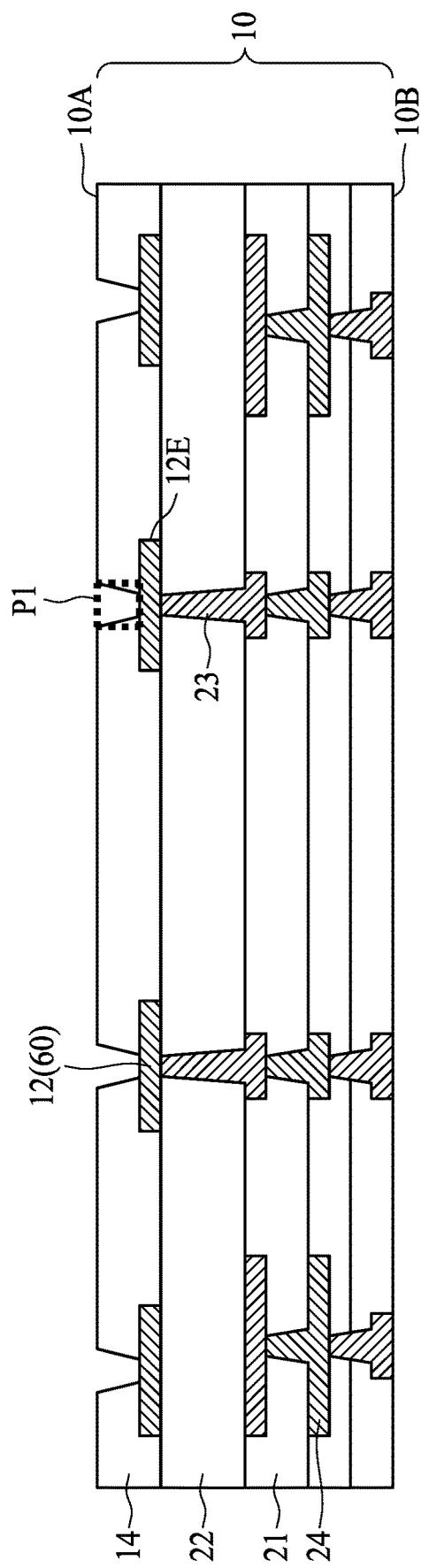
FIG. 8A, FIG. 8B, FIG. 8C and FIG. 8D illustrate operations for manufacturing an electronic device package in accordance with some embodiments of the present disclosure.

FIG. 8A, FIG. 8B, FIG. 8C and FIG. 8D illustrate operations for manufacturing an electronic device package 5 in accordance with some embodiments of the present disclosure. Referring to FIG. 8A, a first substrate 10 is provided. The first substrate 10 may be a pre-formed substrate. The first substrate 10 may include a core layer 21, one or more dielectric layers 22 and one or more circuit layers 24 stacked to one another. The first substrate 10 may further include bonding pads 12, and a passivation layer 14 defining first portions P1 of the cavities C exposing the bonding pads 12. In some embodiments, the core layer 21 may be omitted.

Figure 8B:
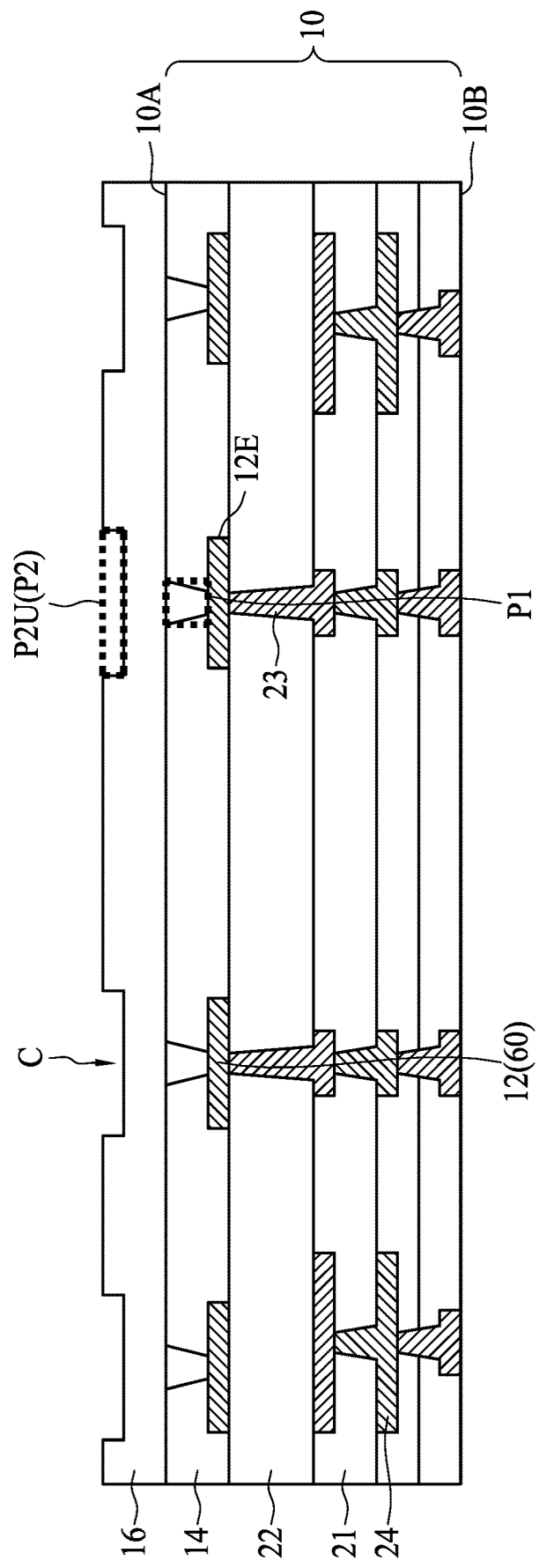

As shown in FIG. 8B, an adhesion layer 16 is then laminated on the first substrate 10. In some embodiments, a pre-lamination may be performed on the adhesion layer 16 and the first substrate 10. The adhesion layer 16 can be patterned to form an upper portion P2U of the second portion P2 of the cavity C. The upper portion P2U can be formed by drilling such laser drilling.

Figure 8C:
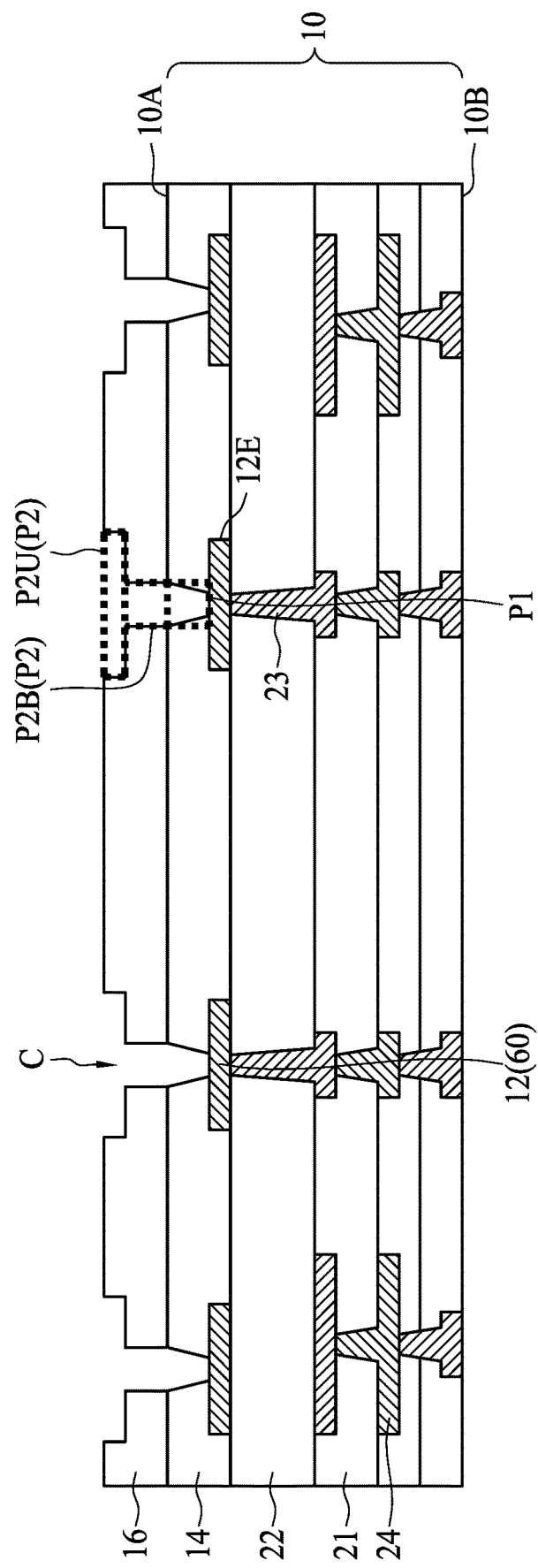

As shown in FIG. 8C, the adhesion layer 16 can be re-patterned to form a bottom portion P2B of the second portion P2 of the cavity C in communication with the first portion P1 of the cavity C. The bottom portion P2B can be formed by drilling such laser drilling.

Figure 8D:
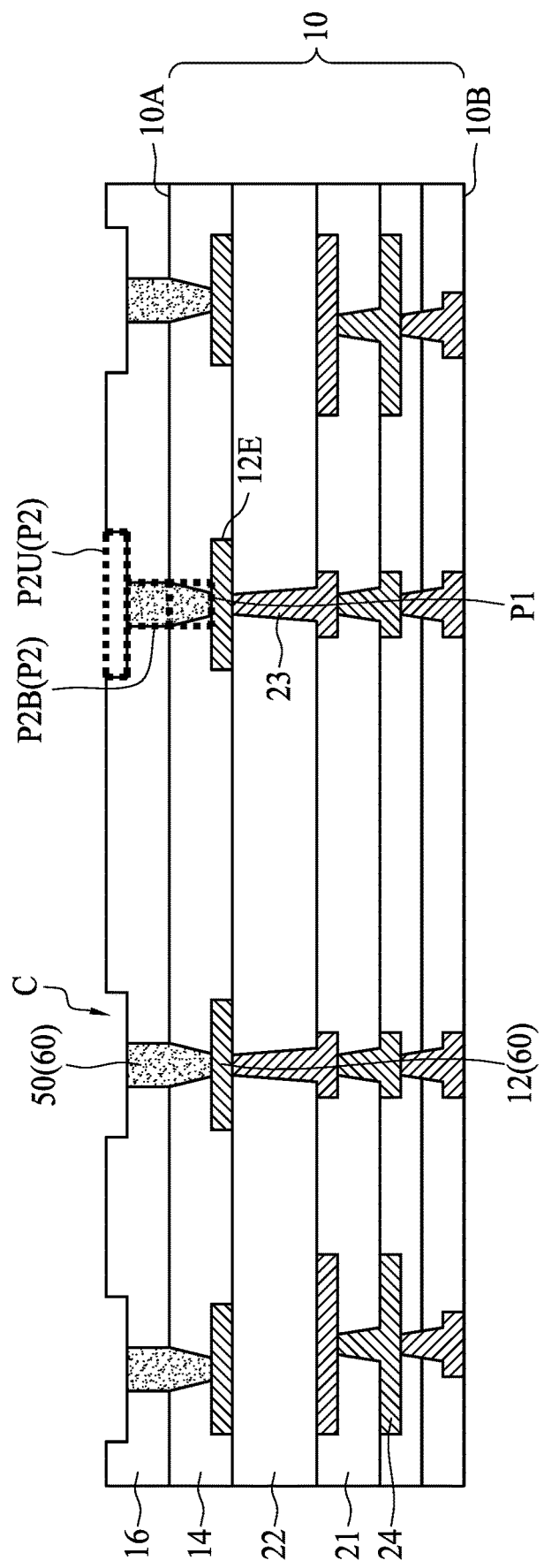

As shown in FIG. 8D, a conductive layer 50 is formed in the bottom portion P2B and the first portion P1 of the cavity C on the bonding pads 42 exposed from the passivation layer 14 and the adhesion layer 16. A second substrate 30 is then laminated on the adhesion layer 16 to form an electronic device package 5 as illustrated in FIG. 7.

Figure 9:
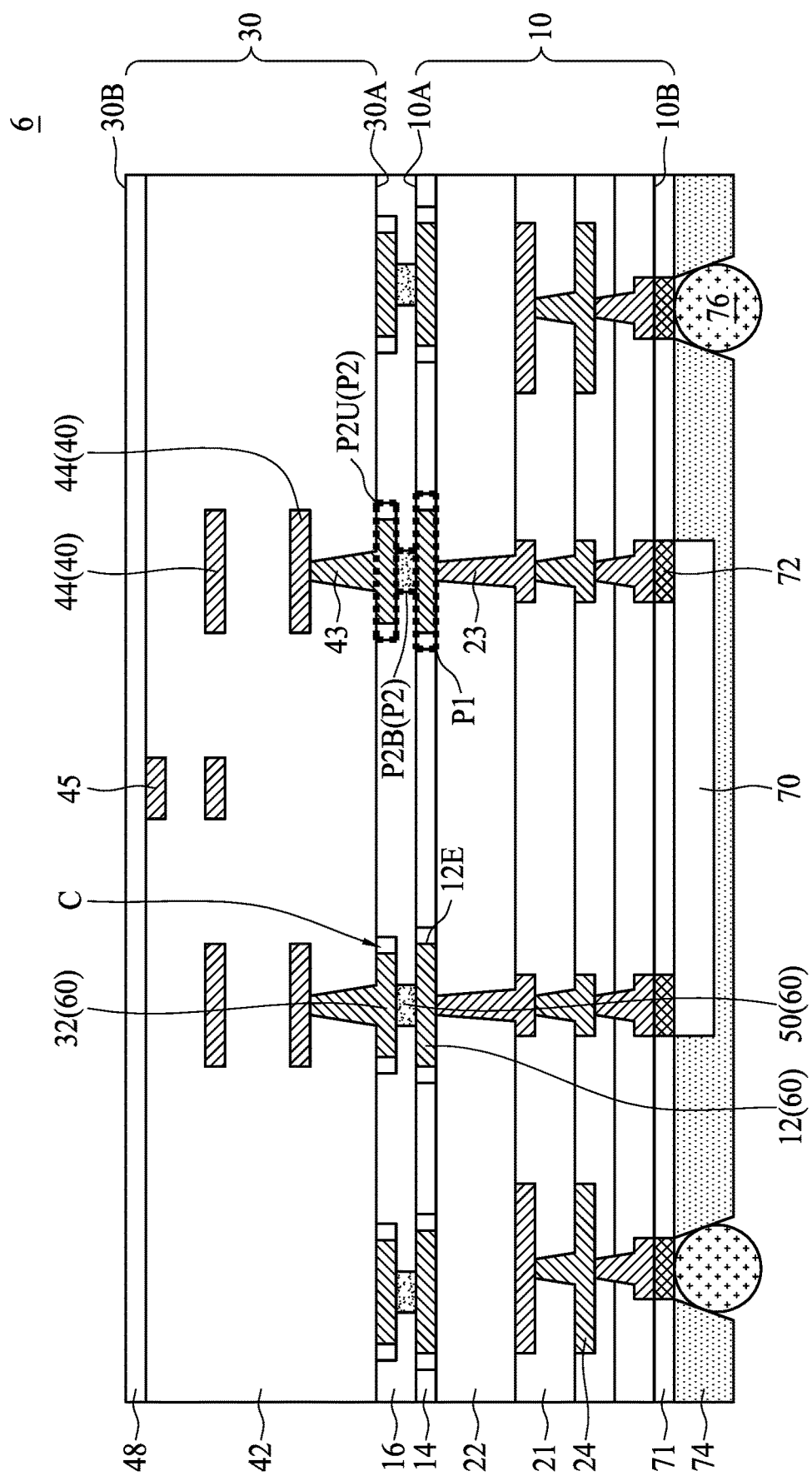
FIG. 9 is a cross-sectional view of an electronic device package in accordance with some embodiments of the present disclosure.

FIG. 9 is a cross-sectional view of an electronic device package 6 in accordance with some embodiments of the present disclosure. As shown in FIG. 9, the passivation layer 14 is spaced from the bonding pad 12 with a gap, and defines the first portion P1 of the cavity C. The adhesion layer 16 may have a step-shaped profile. For example, the second portion P2 of the cavity C defined by the adhesion layer 16 may have an upper portion P2U wider than a bottom portion P2B. In some embodiments, the bottom portion P2B of the second portion P2 of the cavity C are filled with the conductive layer 50, while the first portion P1 and the upper portion P2U are not filled with the conductive layer 50. In some embodiments, the width or cross-sectional area of the bottom portion P2B is substantially equal to that of the first portion P1. In some embodiments, the width or cross-sectional area of the bottom portion P2B is narrower compared to that of the upper portion P2U, and thus the resistance of the conductive layer 50 in the central region can be reduced to be close to that in the perimeter region to alleviate skin effect. Accordingly, signal transmission loss can be mitigated, particularly in high frequency application. In addition, the narrower bottom portion P2B also helps to guide the conductive layer 50, and thus can increase alignment accuracy.

Figure 10:
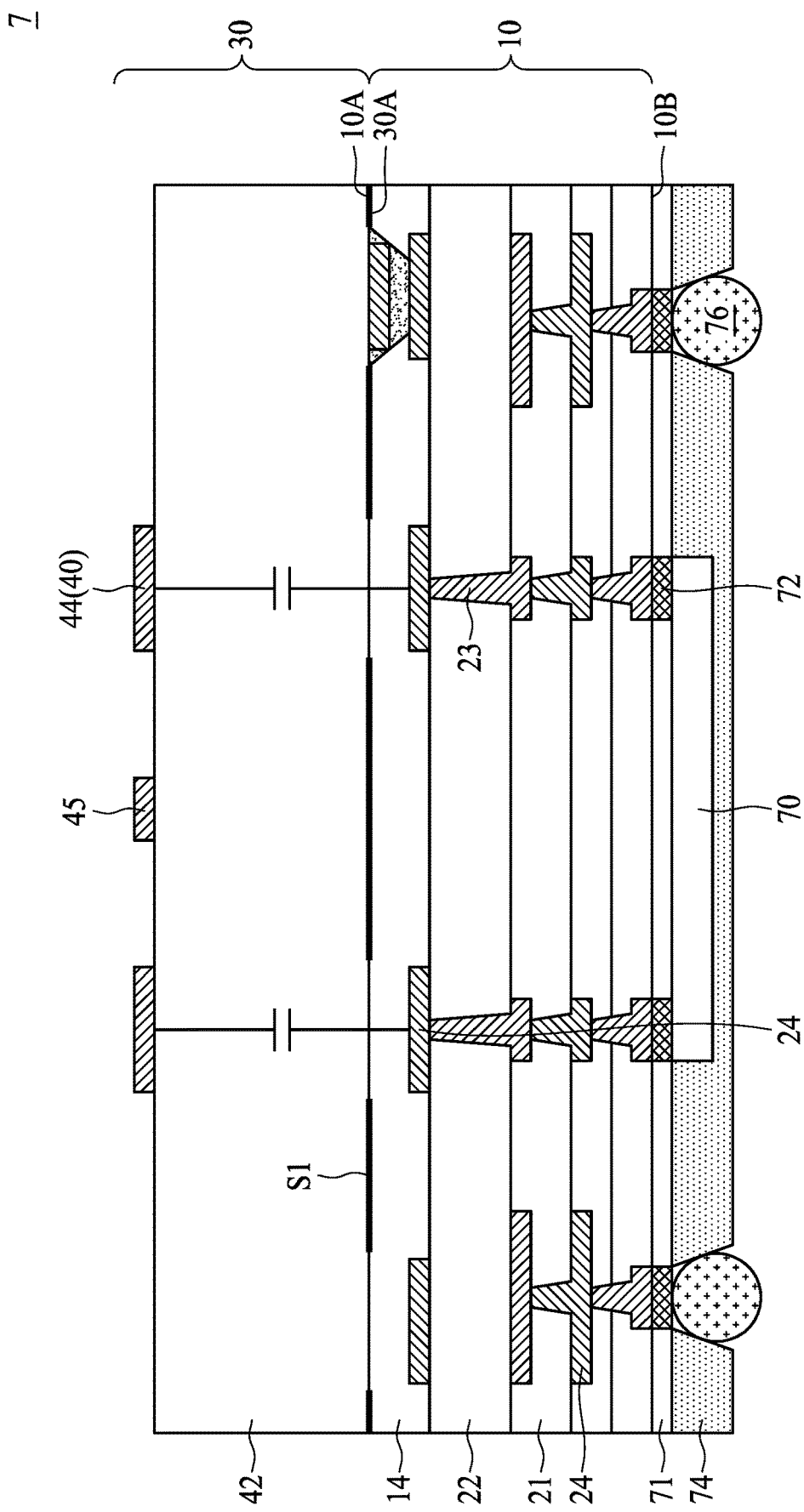
FIG. 10 is a cross-sectional view of an electronic device package in accordance with a comparative embodiment of the present disclosure.

FIG. 10 is a cross-sectional view of an electronic device package 7 in accordance with a comparative embodiment of the present disclosure. As shown in FIG. 10, the second substrate 30 of the comparative embodiments is a glass substrate, and it is difficult and expensive to form circuit layer in the glass substrate. Thus, the circuit layer 24 of the first substrate 10 is electrically coupled to the circuit layer 44 of the antenna 40 of the second substrate 30 through the heterogeneous interface S1. The coupling through the heterogeneous interface S1, however, significantly increases the signal transmission loss. In addition, the dielectric constant (Dk) of glass is about 5 to about 10, and thus the thickness of the glass substrate must be increased to obtain the same gain as the electronic device packages disclosed in previous embodiments of the present disclosure.

In some embodiments of the present disclosure, the electronic device package includes two or more heterogeneous substrates or layers laminated to each other. The heterogeneous substrates are selected to meet different requirements of the electronic device package. For example, a high-k and rigid substrate is used to meet the requirement of RF circuit, and a low-k and soft substrate is used to meet the peak gain requirement of antenna with reduced thickness. The electronic device package includes a conductive structure penetrating through the heterogeneous interface between heterogeneous substrates. The RF circuit and the antenna circuit of the heterogeneous substrates are directly connected through the heterogeneous interface by the conductive structure rather than being electrically coupled to each other, and thus the signal transmission loss across the heterogeneous interface is mitigated. The thickness of the electronic device package of the present disclosure may be controlled to be substantially equal to or less than 1 mm, and the power consumption of the device package may be controlled to be less than 5 W.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic device package, comprising:
   a first substrate;
   a second substrate disposed over the first substrate;
   an encapsulant disposed between the first substrate and the second substrate; and
   a conductive element encapsulated by the encapsulant and configured to electrically connect the first substrate to the second substrate,
   wherein the encapsulant has a bottom surface, a first upper surface opposite to the bottom surface, and an indented portion between the first upper surface and the bottom surface, and the indented portion is spaced apart from the bottom surface, and
   wherein the indented portion of the encapsulant further has a second upper surface and a lateral surface extending between the first upper surface and the second upper surface, and the lateral surface is spaced apart from the conductive element.

2. The electronic device package of claim 1, wherein the first upper surface is in substantially parallel with the second upper surface.

3. The electronic device package of claim 1, wherein the second substrate comprises a pad in contact with the second upper surface of the encapsulant.

4. The electronic device package of claim 3, wherein the pad is free from contacting the lateral surface of the encapsulant.

5. The electronic device package of claim 1, wherein the second upper surface of the indented portion of the encapsulant is substantially level with a surface of the conductive element.

6. The electronic device package of claim 1, further comprising a passivation layer disposed between the encapsulant and the first substrate, wherein the first substrate comprises a pad exposed by the passivation layer, and the pad is spaced apart from a lateral surface of the passivation layer.

7. The electronic device package of claim 1, further comprising a passivation layer disposed between the encapsulant and the first substrate, wherein the passivation layer defines a first cavity, and the encapsulant defines a second cavity connected to the first cavity.

8. The electronic device package of claim 7, wherein the conductive element is within the first cavity and in contact with a pad of the first substrate.

9. The electronic device package of claim 7, wherein a portion of the encapsulant is disposed over the first cavity.

10. The electronic device package of claim 7, wherein a sidewall of the second cavity is over a pad of the first substrate.

11. The electronic device package of claim 7, wherein a sidewall of the first cavity is non-parallel with a sidewall of the second cavity.

12. The electronic device package of claim 1, wherein the encapsulant comprises a thermoset tape laminated over the first substrate and connecting with the second substrate.

* * * * *